United States Patent
Oh et al.

(10) Patent No.: US 9,318,695 B2
(45) Date of Patent: Apr. 19, 2016

(54) MAGNETIC MEMORY DEVICES HAVING A UNIFORM PERPENDICULAR NONMAGNETIC RICH ANTISOTROPY ENHANCED PATTERN

(71) Applicants: Sechung Oh, Suwon-si (KR); Jangeun Lee, Suwon-si (KR); Woojin Kim, Yongin-si (KR); Heeju Shin, Yongin-si (KR)

(72) Inventors: Sechung Oh, Suwon-si (KR); Jangeun Lee, Suwon-si (KR); Woojin Kim, Yongin-si (KR); Heeju Shin, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 14/614,724

(22) Filed: Feb. 5, 2015

(65) Prior Publication Data
US 2015/0145081 A1 May 28, 2015

Related U.S. Application Data

(62) Division of application No. 14/196,666, filed on Mar. 4, 2014, now Pat. No. 8,987,850, which is a division of application No. 13/181,957, filed on Jul. 13, 2011, now Pat. No. 8,692,342.

(30) Foreign Application Priority Data

Jul. 26, 2010 (KR) ........................ 10-2010-0072051

(51) Int. Cl.
| | | |
|---|---|---|
| H01L 43/02 | (2006.01) | |
| H01L 27/22 | (2006.01) | |
| H01L 43/08 | (2006.01) | |
| H01L 43/12 | (2006.01) | |
| H01L 43/10 | (2006.01) | |

(52) U.S. Cl.
CPC ............... *H01L 43/02* (2013.01); *H01L 43/08* (2013.01); *H01L 43/12* (2013.01); *H01L 27/222* (2013.01); *H01L 43/10* (2013.01)

(58) Field of Classification Search
CPC ....... H01L 27/222; H01L 43/02; H01L 43/08; H01L 43/10; H01L 43/12
See application file for complete search history.

(56) References Cited

U.S. PATENT DOCUMENTS

| | | | | |
|---|---|---|---|---|
| 6,016,241 A * | 1/2000 | Coffey | ................... | B82Y 10/00 257/E43.005 |
| 6,169,688 B1 * | 1/2001 | Noguchi | ................ | G11C 11/15 257/E27.005 |
| 6,730,395 B2 | 5/2004 | Covington | | |

(Continued)

FOREIGN PATENT DOCUMENTS

| | | |
|---|---|---|
| JP | 2000156531 A | 6/2000 |
| JP | 2006100667 A | 4/2006 |

(Continued)

*Primary Examiner* — Ida M Soward
(74) *Attorney, Agent, or Firm* — Harness, Dickey & Pierce, P.L.C.

(57) ABSTRACT

Provided are magnetic memory devices, electronic systems and memory cards including the same, methods of manufacturing the same, and methods of controlling a magnetization direction of a magnetic pattern. In a magnetic memory device, atomic-magnetic moments non-parallel to one surface of a free pattern increase in the free pattern. Therefore, critical current density of the magnetic memory device may be reduced, such that power consumption of the magnetic memory device is reduced or minimized and/or the magnetic memory device is improved or optimized for a higher degree of integration.

4 Claims, 33 Drawing Sheets

(56) References Cited

U.S. PATENT DOCUMENTS

| | | | |
|---|---|---|---|
| 6,730,949 B2* | 5/2004 | Kishi | B82Y 25/00 257/295 |
| 7,088,609 B2 | 8/2006 | Valet | |
| 7,177,122 B2* | 2/2007 | Hou | G11B 5/3948 360/324.12 |
| 7,280,389 B2 | 10/2007 | Guo | |
| 7,486,486 B2 | 2/2009 | Nakamura et al. | |
| 7,535,069 B2 | 5/2009 | Abraham et al. | |
| 7,535,683 B2* | 5/2009 | Meguro | G11B 5/3912 360/324.12 |
| 7,598,578 B2* | 10/2009 | Nakamura | B82Y 25/00 257/421 |
| 7,602,033 B2 | 10/2009 | Zhao et al. | |
| 7,787,288 B2 | 8/2010 | Kitagawa et al. | |
| 7,796,428 B2 | 9/2010 | Redon | |
| 7,807,218 B2 | 10/2010 | Parkin | |
| 7,817,375 B2* | 10/2010 | Sato | B82Y 25/00 360/125.31 |
| 7,842,409 B2 | 11/2010 | Girt | |
| 7,888,755 B2 | 2/2011 | Hosomi et al. | |
| 7,898,833 B2 | 3/2011 | Prejbeanu et al. | |
| 7,902,616 B2 | 3/2011 | Klostermann et al. | |
| 7,906,231 B2 | 3/2011 | Parkin | |
| 7,920,363 B2* | 4/2011 | Pinarbasi | B82Y 10/00 360/324.2 |
| 7,932,571 B2* | 4/2011 | Rizzo | G11C 11/16 257/421 |
| 7,936,597 B2 | 5/2011 | Clinton et al. | |
| 7,948,044 B2 | 5/2011 | Horng et al. | |
| 7,999,336 B2 | 8/2011 | Wang et al. | |
| 8,023,315 B2* | 9/2011 | Fukami | B82Y 10/00 365/157 |
| 8,036,025 B2 | 10/2011 | Nagase et al. | |
| 8,072,789 B2 | 12/2011 | Ikarashi et al. | |
| 8,085,582 B2* | 12/2011 | Nakamura | G11B 5/66 365/158 |
| 8,098,514 B2 | 1/2012 | Nagase et al. | |
| 8,149,547 B2 | 4/2012 | Ohta et al. | |
| 8,164,862 B2 | 4/2012 | Zhang et al. | |
| 8,183,653 B2 | 5/2012 | Peng et al. | |
| 8,184,408 B2 | 5/2012 | Murakami et al. | |
| 8,188,558 B2 | 5/2012 | Wang et al. | |
| 8,223,533 B2 | 7/2012 | Ozeki et al. | |
| 8,279,666 B2 | 10/2012 | Dieny et al. | |
| 8,335,058 B2 | 12/2012 | Xue et al. | |
| 8,363,462 B2 | 1/2013 | Nagase et al. | |
| 8,406,041 B2 | 3/2013 | Shukh | |
| 8,456,898 B2 | 6/2013 | Chen et al. | |
| 8,493,777 B2 | 7/2013 | Ranjan et al. | |
| 2002/0074541 A1 | 6/2002 | Covington | |
| 2005/0254287 A1 | 11/2005 | Valet | |
| 2007/0063690 A1 | 3/2007 | De Wilde et al. | |
| 2008/0094886 A1 | 4/2008 | Ranjan et al. | |
| 2008/0180991 A1 | 7/2008 | Wang | |
| 2009/0244960 A1 | 10/2009 | Saito et al. | |
| 2009/0262638 A1 | 10/2009 | Xi et al. | |
| 2010/0041168 A1 | 2/2010 | Nam et al. | |
| 2010/0109110 A1 | 5/2010 | Wang et al. | |
| 2010/0110591 A1* | 5/2010 | Katou | G11C 11/15 360/245.8 |
| 2010/0136713 A1* | 6/2010 | Horng | B82Y 25/00 438/3 |

FOREIGN PATENT DOCUMENTS

| | | |
|---|---|---|
| JP | 2007019179 A | 1/2007 |
| JP | 2007103692 A | 4/2007 |

* cited by examiner

MAGNETIC MEMORY DEVICES HAVING A UNIFORM PERPENDICULAR NONMAGNETIC RICH ANTISOTROPY ENHANCED PATTERN

CROSS-REFERENCE TO RELATED APPLICATIONS

This U.S. non-provisional patent application is a divisional of U.S. application Ser. No. 14/196,666, filed on Mar. 4, 2014, which is a divisional application of U.S. application Ser. No. 13/181,957 filed on Jul. 13, 2011, and issued as U.S. Pat. No. 8,692,342 on Apr. 8, 2014, which claims priority under 35 U.S.C. §119 of Korean Patent Application No. 10-2010-0072051, filed on Jul. 26, 2010, the entire contents of each of which are hereby incorporated by reference.

BACKGROUND

Inventive concepts disclosed herein relate to a semiconductor memory device, for example, to magnetic memory devices, electronic systems and memory cards including the same, methods of manufacturing the same, and methods of controlling a magnetization direction of a magnetic pattern.

As faster and lower power consuming electronic devices are desired, semiconductor memory devices used therein also need to have a faster read/write operation and/or a lower operating voltage. As one plan to satisfy one or more of the above requirements, a magnetic memory device has been proposed as a semiconductor memory. Since the magnetic memory device operates at higher speed and has a nonvolatile characteristic, it has drawn attention as a next generation memory device.

A magnetic memory device may include a magnetic tunnel junction (MTJ). A MTJ may include two magnetic materials and a tunnel barrier layer disposed therebetween. Depending on the magnetization directions of the two magnetic materials, a resistance value of the MTJ may vary. For example, when the magnetization directions of the two magnetic materials are anti-parallel to each other, the MTJ may have a relatively large resistance value and when the magnetization directions of the two magnetic materials are parallel to each other, the MTJ may have a relatively small resistance value. By using a difference between the resistance values, the magnetic memory device may be used to write/read data.

SUMMARY

Example embodiments of inventive concepts may provide a magnetic memory device reducing power consumption.

Example embodiments of inventive concepts may also provide a magnetic memory device having improved reliability.

Example embodiments of inventive concepts may also provide a magnetic memory device with increased degree of integration In example embodiments of inventive concepts, a magnetic memory device may include: a uniform free pattern on a substrate and having a first surface and a second surface opposite to each other; a reference pattern on the substrate; a tunnel barrier pattern between the first surface of the uniform free pattern and the reference pattern; and a nonmagnetic metal-oxide pattern contacting the second surface of the uniform free pattern, wherein a content ratio of a nonmagnetic metal in the nonmagnetic metal-oxide pattern is greater than a stoichiometric ratio and a concentration of the nonmagnetic metal is substantially uniform over the entire nonmagnetic metal-oxide pattern.

In example embodiments of inventive concepts, the nonmagnetic metal-oxide pattern may generate atomic-magnetic moments, substantially perpendicular to the second surface of the uniform free pattern, in a surface portion including the second surface of the uniform free pattern.

In example embodiments of inventive concepts, the reference pattern may have a fixed magnetization direction parallel to the second surface of the uniform free pattern, a magnetization direction of the uniform free pattern may be changeable to a direction parallel or anti-parallel to the fixed magnetization direction of the reference pattern, and an amount of atomic-magnetic moments non-parallel to the second surface may be increased in the uniform free pattern by the nonmagnetic metal-oxide pattern.

In example embodiments of inventive concepts, the uniform free pattern may include iron (Fe) and cobalt (Co); and a content ratio of iron (Fe) in the uniform free pattern may be greater than a content ratio of cobalt (Co) in the uniform free pattern.

In example embodiments of inventive concepts, the nonmagnetic metal-oxide pattern may include a tantalum-rich tantalum oxide.

In example embodiments of inventive concepts, the magnetic memory devices may further include a surface local region partially in the second surface of the uniform free pattern. The surface local region may include a material different from a magnetic material of the uniform free pattern.

In example embodiments of inventive concepts, the nonmagnetic metal-oxide pattern may include a first portion of an amorphous state and a second portion of a crystalline state; and the surface local region contacts the second portion of the nonmagnetic metal-oxide pattern.

In example embodiments of inventive concepts, the surface local region may include an oxide formed by oxidizing a portion of the magnetic material of the uniform free pattern.

In example embodiments of inventive concepts, the magnetic memory devices may further include particles within the uniform free pattern, the particles including a material different from the uniform free pattern.

In example embodiments of inventive concepts, the reference pattern, the tunnel barrier pattern, and the uniform free pattern may correspond to a first reference pattern, a first tunnel barrier pattern, and a first uniform free pattern, respectively. In example embodiments of inventive concepts, the magnetic memory devices may further include: a second uniform free pattern including a first surface and a second surface opposite to each other; a second reference pattern on the first surface of the second uniform free pattern; and a second tunnel barrier pattern between the first surface of the second uniform free pattern and the second reference pattern, wherein the nonmagnetic metal-oxide pattern is between the second surface of the first uniform free pattern and the second surface of the second uniform free pattern.

In example embodiments of inventive concepts, the nonmagnetic metal-oxide pattern may have a substantially uniform thickness.

In example embodiments of inventive concepts, the reference pattern may include a first magnetic material, the uniform free pattern may include a second magnetic material, and each of the first and second magnetic materials may include iron (Fe). A content ratio of iron (Fe) in the second magnetic material may be equal to or greater than that in the first magnetic material.

In example embodiments of inventive concepts, the nonmagnetic metal-oxide pattern may have a thickness of about 2 Å to about 20 Å.

In example embodiments of inventive concepts of inventive concepts, magnetic memory devices may include: a reference pattern on a substrate; a free pattern on the substrate; a tunnel barrier pattern between the free pattern and the reference pattern; and a surface local region partially in one surface of the free pattern and including a material different from the free pattern.

In example embodiments of inventive concepts, the surface local region may include an oxide formed by oxidizing a portion of the one surface of the free pattern or a nitride formed by nitrifying a portion of the one side of the free pattern.

In example embodiments of inventive concepts, the free pattern may include a first surface adjacent to the tunnel barrier pattern and a second surface opposite to the first surface, and the surface local region may be partially in of the second surface of the free pattern.

In example embodiments of inventive concepts, the magnetic memory devices may further include a thin pattern on the second surface of the free pattern.

In example embodiments of inventive concepts, the thin pattern may include a first portion having a first thickness and a second portion having a thinner second thickness than the first thickness. The surface local region may be directly below the second portion.

In example embodiments of inventive concepts, the thin pattern may include a first portion of an amorphous state and a second portion of a crystalline state. The surface local region may be directly below the second portion of the thin pattern.

In example embodiments of inventive concepts, the reference pattern, the tunnel barrier pattern, and the free pattern may correspond to a first reference pattern, a first tunnel barrier pattern, and a first free pattern, respectively. In example embodiments of inventive concepts, the magnetic memory devices may further include: a second free pattern including a first surface and a second surface opposite to each other; a second reference pattern on the first surface of the second free pattern; and a second tunnel barrier pattern between the first surface of the second free pattern and the second reference pattern, wherein the thin pattern is between the second surface of the first free pattern and the second surface of the second free pattern.

In example embodiments of inventive concepts, the magnetic memory devices may further include particles within the free pattern. The particles may include a material different from the free pattern.

In example embodiments of inventive concepts, the reference pattern may include a first magnetic material, the free pattern may include a second magnetic material, and each of the first and second magnetic materials may include iron (Fe). A content ratio of iron (Fe) in the second magnetic material may be equal to or greater than a content ratio of iron (Fe) in the first magnetic material.

In example embodiments of inventive concepts of inventive concepts, magnetic memory devices may include: a reference pattern on a substrate; a free pattern on the substrate; a tunnel barrier pattern between the free pattern and the reference pattern; and particles within the free pattern and including a nonmagnetic conductive material.

In example embodiments of inventive concepts, the free pattern may include a first surface and a second surface opposite to each other. The first surface of the free pattern may be adjacent to the tunnel barrier pattern, and the particles may be spaced from the first and second surfaces.

In example embodiments of inventive concepts, the free pattern may include a first surface adjacent to the tunnel barrier pattern and a second surface opposite to the first surface, and the reference pattern and the tunnel barrier pattern may correspond to a first reference pattern and a first tunnel barrier pattern, respectively. In example embodiments of inventive concepts, the magnetic memory devices may further include: a second reference pattern on the second surface of the free pattern; and a second tunnel barrier pattern between the second surface of the free pattern and the second reference pattern.

In example embodiments of inventive concepts, the reference pattern may includes a first magnetic material, the free pattern may include a second magnetic material, and each of the first and second magnetic materials may include iron (Fe). A content ratio of iron (Fe) in the second magnetic material may be equal to or greater than a content ratio of iron (Fe) in the first magnetic material In example embodiments of inventive concepts of inventive concepts, magnetic memory devices may include: a uniform free pattern on a substrate and including a first surface and a second surface opposite to each other; a reference pattern on the substrate and having a fixed magnetization direction perpendicular to the second surface of the uniform free pattern; a tunnel barrier pattern between the first surface of the uniform free pattern and the reference pattern; and a uniform perpendicular nonmagnetic metal rich anisotropy enhanced pattern contacting the second surface of the uniform free pattern to generate atomic-magnetic moments perpendicular to the second surface of the uniform free pattern, wherein a magnetization direction of the uniform free pattern is changeable to parallel or anti-parallel to the fixed magnetization direction of the reference pattern.

In example embodiments of inventive concepts, the uniform free pattern may include iron (Fe) and cobalt (Co); and a content ratio of iron (Fe) in the uniform free pattern is greater than a content ratio of cobalt (Co) in the uniform free pattern.

In example embodiments of inventive concepts, the reference pattern may include: a reference perpendicular magnetic pattern having a first magnetization direction perpendicular to the second surface of the uniform free pattern; and a spin polarization pattern between the reference perpendicular magnetic pattern and the tunnel barrier pattern and having a second magnetization direction perpendicular to the second surface of the uniform free pattern.

In example embodiments of inventive concepts, the reference pattern may further include an exchange coupling pattern between the reference perpendicular magnetic pattern and the tunnel barrier pattern. The exchange coupling pattern may combine the first and second magnetization directions to be parallel or anti-parallel to each other.

In example embodiments of inventive concepts, the magnetic memory devices may further include a fixed perpendicular magnetic pattern on one surface of the perpendicular anisotropy enhanced pattern. The uniform perpendicular nonmagnetic metal rich anisotropy enhanced pattern may be between the uniform free pattern and the fixed perpendicular magnetic pattern, and the fixed perpendicular magnetic pattern may have a fixed magnetization direction perpendicular to the second surface of the uniform free pattern.

In example embodiments of inventive concepts, the magnetic memory devices may further include a free perpendicular magnetic pattern on one surface of the perpendicular anisotropy enhanced pattern. The uniform perpendicular nonmagnetic metal rich anisotropy enhanced pattern may be between the uniform free pattern and the free perpendicular magnetic pattern, and a magnetization direction of the free perpendicular magnetic pattern may be changeable to be parallel or anti-parallel to the fixed magnetization direction of the reference pattern.

In example embodiments of inventive concepts, a magnetic memory device may include a free pattern on a substrate, and having a first surface and a second surface opposite to each other, a reference pattern on the substrate, a tunnel barrier pattern between the first surface of the free pattern and the reference pattern, and a non-magnetic non-parallel magnetism generator contacting the free pattern, the non-magnetic non-parallel magnetism generator increasing a magnetization of the free layer in a direction non-parallel to the second surface.

In example embodiments of inventive concepts, the non-magnetic non-parallel magnetism generator increases a number of magnetic moments non-parallel to the second surface.

In example embodiments of inventive concepts, the free pattern is made of an inplane magnetic material, whose magnetization, without an effect of the non-magnetic non-parallel magnetism generator is substantially in a direction parallel to the second surface.

In example embodiments of inventive concepts, at least one of a thickness and a material of at least one of the free pattern and the non-magnetic non-parallel magnetism generator is selected to convert a portion of the magnetization of the free pattern from the direction parallel to the second surface, to the direction non-parallel to the second surface.

In example embodiments of inventive concepts, the free pattern is a uniform material.

In example embodiments of inventive concepts, the non-magnetic non-parallel magnetism generator includes a non-magnetic metal-oxide pattern in contact with the second surface of the free pattern.

In example embodiments of inventive concepts, a content ratio of a nonmagnetic metal in the nonmagnetic metal-oxide pattern is greater than a stoichiometric ratio, and a concentration of the nonmagnetic metal is substantially uniform over the entire nonmagnetic metal-oxide pattern.

In example embodiments of inventive concepts, the non-magnetic metal-oxide pattern generates atomic-magnetic moments, substantially perpendicular to the second surface of the free pattern, in a surface portion including the second surface of the free pattern.

In example embodiments of inventive concepts, the reference pattern has a fixed magnetization direction parallel to the second surface of the free pattern, a magnetization direction of the free pattern is changeable to a direction parallel or anti-parallel to the fixed magnetization direction of the reference pattern, and an amount of atomic-magnetic moments non-parallel to the second surface is increased in the free pattern by the nonmagnetic metal-oxide pattern.

In example embodiments of inventive concepts, the free pattern includes iron (Fe) and cobalt (Co) and a content ratio of the iron (Fe) in the free pattern is greater than a content ratio of cobalt (Co) in the free pattern.

In example embodiments of inventive concepts, the non-magnetic metal-oxide pattern includes a tantalum-rich tantalum oxide.

In example embodiments of inventive concepts, the non-magnetic non-parallel magnetism generator further includes a surface local region partially on the second surface of the free pattern, wherein the surface local region includes a material different from a magnetic material in the free pattern.

In example embodiments of inventive concepts, the non-magnetic metal-oxide pattern includes a first portion of an amorphous state and a second portion of a crystalline state and the surface local region contacts the second portion of the nonmagnetic metal-oxide pattern.

In example embodiments of inventive concepts, the surface local region includes an oxide formed by oxidizing a portion of the magnetic material of the free pattern.

In example embodiments of inventive concepts, the non-magnetic non-parallel magnetism generator further includes particles within the free pattern, the particles including a material different from the free pattern.

In example embodiments of inventive concepts, the reference pattern, the tunnel barrier pattern, and the free pattern correspond to a first reference pattern, a first tunnel barrier pattern, and a first free pattern, respectively, and the magnetic memory device further includes a second free pattern including a first surface and a second surface opposite to each other, a second reference pattern on the first surface of the second free pattern, and a second tunnel barrier pattern between the first surface of the second free pattern and the second reference pattern, wherein the nonmagnetic metal-oxide pattern is between the second surface of the first free pattern and the second surface of the second free pattern.

In example embodiments of inventive concepts, the non-magnetic metal-oxide pattern has a substantially uniform thickness.

In example embodiments of inventive concepts, the reference pattern includes a first magnetic material, the free pattern includes a second magnetic material, each of the first and second magnetic materials includes iron (Fe), and a content ratio of iron (Fe) in the second magnetic material is equal to or greater than that in the first magnetic material.

In example embodiments of inventive concepts, the non-magnetic metal-oxide pattern has a thickness of about 2 Å to about 20 Å.

In example embodiments of inventive concepts, the non-magnetic non-parallel magnetism generator is a surface local region partially in one surface of the free pattern and including a material different from the free pattern.

In example embodiments of inventive concepts, the surface local region includes an oxide formed by oxidizing a portion of the one surface of the free pattern or a nitride formed by nitrifying a portion of the one side of the free pattern.

In example embodiments of inventive concepts, the free pattern includes a first surface adjacent to the tunnel barrier pattern and a second surface opposite to the first surface and the surface local region is partially in the second surface of the free pattern.

In example embodiments of inventive concepts, the non-magnetic non-parallel magnetism generator further includes a thin pattern on the second surface of the free pattern.

In example embodiments of inventive concepts, the thin pattern includes a first portion having a first thickness and a second portion having a thinner second thickness than the first thickness and the surface local region is directly below the second portion.

In example embodiments of inventive concepts, the thin pattern includes a first portion of an amorphous state and a second portion of a crystalline state and the surface local region is directly below the second portion of the thin pattern.

In example embodiments of inventive concepts, the reference pattern, the tunnel barrier pattern, and the free pattern correspond to a first reference pattern, a first tunnel barrier pattern, and a first free pattern, respectively, and the magnetic memory device further includes a second free pattern including a first surface and a second surface opposite to each other, a second reference pattern on the first surface of the second free pattern, and a second tunnel barrier pattern between the first surface of the second free pattern and the second reference pattern, wherein the thin pattern is between the second surface of the first free pattern and the second surface of the second free pattern.

In example embodiments of inventive concepts, the non-magnetic non-parallel magnetism generator further includes particles within the free pattern, wherein the particles include a material different from the free pattern.

In example embodiments of inventive concepts, the reference pattern includes a first magnetic material, the free pattern includes a second magnetic material, each of the first and second magnetic materials includes iron (Fe), and a content ratio of iron (Fe) in the second magnetic material is equal to or greater than a content ratio of iron (Fe) in the first magnetic material.

In example embodiments of inventive concepts, the non-magnetic non-parallel magnetism generator includes a surface local region partially on the second surface of the free pattern, wherein the surface local region includes a material different from a magnetic material in the free pattern.

In example embodiments of inventive concepts, the non-magnetic non-parallel magnetism generator includes particles within the free pattern and including a nonmagnetic conductive material.

In example embodiments of inventive concepts, the free pattern includes a first surface and a second surface opposite to each other, the first surface of the free pattern is adjacent to the tunnel barrier pattern, and the particles are spaced from the first and second surfaces.

In example embodiments of inventive concepts, the free pattern includes a first surface adjacent to the tunnel barrier pattern and a second surface opposite to the first surface, and the reference pattern and the tunnel barrier pattern correspond to a first reference pattern and a first tunnel barrier pattern, respectively, and the magnetic memory device further includes a second reference pattern on the second surface of the free pattern and a second tunnel barrier pattern between the second surface of the free pattern and the second reference pattern.

In example embodiments of inventive concepts, the reference pattern includes a first magnetic material, the free pattern includes a second magnetic material, each of the first and second magnetic materials includes iron (Fe) and a content ratio of iron (Fe) in the second magnetic material is equal to or greater than a content ratio of iron (Fe) in the first magnetic material.

In example embodiments of inventive concepts, the free pattern is made of a perpendicular magnetic material, whose magnetization, without an effect of the non-magnetic non-parallel magnetism generator is less substantially in a direction parallel to the second surface.

In example embodiments of inventive concepts, the non-magnetic non-parallel magnetism generator is a perpendicular anisotropy enhanced pattern contacting the second surface of the free pattern to generate atomic-magnetic moments perpendicular to the second surface of the free pattern, wherein a magnetization direction of the free pattern is changeable to a direction parallel or anti-parallel to the fixed magnetization direction of the reference pattern.

In example embodiments of inventive concepts, the free pattern includes iron (Fe) and cobalt (Co) and a content ratio of iron (Fe) in the free pattern is greater than a content ratio of cobalt (Co) in the free pattern.

In example embodiments of inventive concepts, the reference pattern includes a reference perpendicular magnetic pattern having a first magnetization direction perpendicular to the second surface of the free pattern and a spin polarization pattern between the reference perpendicular magnetic pattern and the tunnel barrier pattern and having a second magnetization direction perpendicular to the second surface of the free pattern.

In example embodiments of inventive concepts, the reference pattern further includes an exchange coupling pattern between the reference perpendicular magnetic pattern and the tunnel barrier pattern and the exchange coupling pattern combines the first and second magnetization directions to be parallel or anti-parallel to each other.

In example embodiments of inventive concepts, a magnetic memory device may further include a fixed perpendicular magnetic pattern on one surface of the perpendicular anisotropy enhanced pattern, wherein the perpendicular anisotropy enhanced pattern is between the free pattern and the fixed perpendicular magnetic pattern and the fixed perpendicular magnetic pattern has a fixed magnetization direction perpendicular to the second surface of the free pattern.

In example embodiments of inventive concepts, the magnetic memory device further including a free perpendicular magnetic pattern on one surface of the perpendicular anisotropy enhanced pattern, wherein the perpendicular anisotropy enhanced pattern is between the free pattern and the free perpendicular magnetic pattern and a magnetization direction of the free perpendicular magnetic pattern is changeable to be parallel or anti-parallel to the fixed magnetization direction of the reference pattern.

In example embodiments of inventive concepts, an electronic system may include an input/output device, connected to a bus, configured to receive and send data externally, an interface, connected to the bus, configured to transmit data to and receive data from a communications network, a controller, connected to the bus, configured to process commands, and a magnetic memory device according to example embodiments of inventive concepts, connected to the bus, configured to store and retrieve data.

In example embodiments of inventive concepts, a memory card may include a magnetic memory device according to example embodiments of inventive concepts, connected to a bus, configured to store and retrieve data, and a controller including a processing unit connected to the bus, configured to control general operations of the memory card, a RAM, connected to the bus, configured as an operating memory of the processing unit, a host interface connected to the bus, configured to implement a data exchange protocol between the memory card and a host, a memory interface connected to the bus, configured to connect the memory controller with the memory device, and an error correction block connected to the bus, configured to detect and correct errors of data read from the magnetic memory device.

In example embodiments of inventive concepts, a method of manufacturing a magnetic memory device may include forming a magnetic tunneling junction including, forming a free pattern on a substrate, and having a first surface and a second surface opposite to each other, forming a reference pattern on the substrate, forming a tunnel barrier pattern between the first surface of the free pattern and the reference pattern, and forming a non-magnetic non-parallel magnetism generator contacting the free pattern, the non-magnetic non-parallel magnetism generator increasing a magnetization of the free pattern in a direction non-parallel to the second surface.

In example embodiments of inventive concepts, the free pattern is made of an inplane magnetic material, whose magnetization, without an effect of the non-magnetic non-parallel magnetism generator is substantially in a direction parallel to the second surface.

In example embodiments of inventive concepts, the free pattern is made of a perpendicular magnetic material, whose magnetization, without an effect of the non-magnetic non-parallel magnetism generator is less substantially in a direction parallel to the second surface.

In example embodiments of inventive concepts, a method of controlling a magnetization direction of a free pattern of magnetic tunneling junction may include forming the magnetic tunneling junction including, forming the free pattern having a thickness and a material on a substrate, and having a first surface and a second surface opposite to each other, forming a reference pattern on the substrate, forming a tunnel barrier pattern between the first surface of the free pattern and the reference pattern, and forming a non-magnetic non-parallel magnetism generator contacting the free pattern, the non-magnetic non-parallel magnetism generator having a thickness, forming a passivation pattern contacting the free pattern, the non-magnetic non-parallel magnetism generator having a thickness, and controlling at least one of the thickness and the material of at least one of the free pattern, a non-magnetic non-parallel magnetism generator, and the passivation pattern to convert a portion of the magnetization of the free pattern from a direction parallel to the second surface, to the direction non-parallel to the second surface.

BRIEF DESCRIPTION OF THE DRAWINGS

The accompanying drawings are included to provide a further understanding of inventive concepts, and are incorporated in and constitute a part of this specification. The drawings illustrate example embodiments of inventive concepts and, together with the description, serve to explain principles of inventive concepts. In the drawings.

DETAILED DESCRIPTION OF EXAMPLE EMBODIMENTS

Figure 1A:
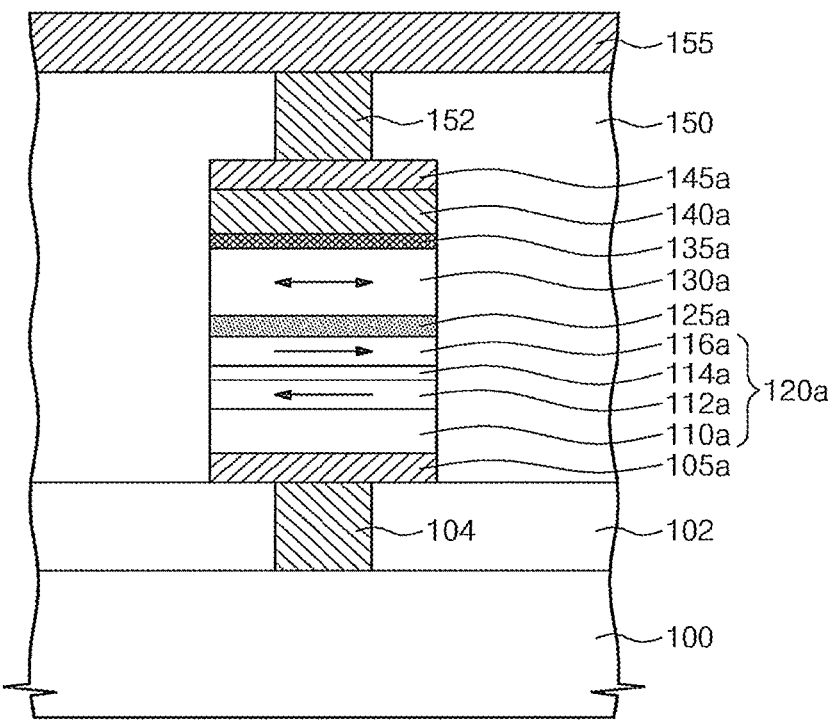
FIG. 1A is a sectional view of a magnetic memory device according to example embodiments of inventive concepts.

Example embodiments of inventive concepts will be described below in more detail with reference to the accompanying drawings. The inventive concept may, however, be embodied in different forms and should not be construed as limited to example embodiments set forth herein. Rather, these example embodiments are provided so that this disclosure will be thorough and complete, and will fully convey the scope of inventive concepts to those skilled in the art.

In the drawings, the dimensions of layers and regions are exaggerated for clarity of illustration. It will also be understood that when a layer (or film) is referred to as being 'on' another layer or substrate, it may be directly on the other layer or substrate, or intervening layers may also be present. Further, it will be understood that when a layer is referred to as being 'under' another layer, it may be directly under, and one or more intervening layers may also be present. In addition, it will also be understood that when a layer is referred to as being 'between' two layers, it may be the only layer between the two layers, or one or more intervening layers may also be present. Like reference numerals refer to like elements throughout.

FIG. 1A is a sectional view of a magnetic memory device according to example embodiments of inventive concepts.

Referring to FIG. 1A, a first interlayer dielectric layer 102 may be disposed on a substrate 100. A switching device (not shown) may be disposed on the substrate 100. The switching device may be a field effect transistor (FET) or a diode. The first interlayer dielectric layer 102 may be disposed on the entire surface of the substrate 100 including the switching device. A lower contact plug 104 may penetrate the first interlayer dielectric layer 102. The lower contact plug 104 may be electrically connected to one end of the switching device. The substrate 100 may be a silicon substrate, a germanium substrate, or a silicon-germanium substrate. The first interlayer dielectric layer 102 may include oxide, nitride and/or oxynitride. The lower contact plug 104 may include dopant-doped semiconductor (e.g., doped silicon, etc.), metal (e.g., titanium, tantalum, tungsten, copper, or aluminum, etc.), conductive metal nitride (e.g., a titanium nitride, a tantalum nitride, etc.) and/or a semiconductor-metal compound (e.g., a metal silicide, etc.)

A reference pattern 120a and a free pattern 130a may be disposed on the first interlayer dielectric layer 102, and a tunnel barrier pattern 125a may be disposed between the reference pattern 120a and the free pattern 130a. The reference pattern 120a, the tunnel barrier pattern 125a, and the free pattern 130a may constitute a magnetic tunnel junction (MTJ) pattern. The free pattern 130a may include a first surface adjacent to the tunnel barrier pattern 125a and a second surface opposite to the first surface. The first and second surfaces of the free pattern 130a may be substantially parallel to the top surface of the substrate 100. According to example embodiment of inventive concepts, as shown in FIG. 1A, the reference pattern 120a, the tunnel barrier pattern 125a, and the free pattern 130a may be sequentially stacked on the first interlayer dielectric layer 102. In example embodiments, the first and second surfaces of the free pattern 130a may correspond to a bottom surface and a top surface of the free pattern 130a, respectively. The reference pattern 120a may be electrically connected to one terminal of the switching device through the lower contact plug 104.

The reference pattern 120a may have a fixed magnetization direction parallel to the top surface of the substrate 100. The reference pattern 120a may include a pinning pattern 110a, a first pinned pattern 112a, an exchange coupling pattern 114a, and/or a second pinned pattern 116a. The first pinned pattern 112a may be adjacent to the pinning pattern 110a and may be disposed between the pinning pattern 110a and the second pinned pattern 116a. The exchange coupling pattern 114a may be disposed between the first and second pinned patterns 112a and 116a. The second pinned pattern 116a may be adjacent to the tunnel barrier pattern 125a. That is, the second pinned pattern 116a may be disposed between the tunnel barrier pattern 125a and the exchange coupling pattern 114a. The pinning pattern 110a may fix a magnetization direction of the first pinned pattern 112a in one direction. The magnetization direction of the first pinned pattern 112a may be parallel to the top surface of the substrate 100. A magnetization direction of the second pinned pattern 116a may be fixed anti-parallel to the magnetization direction of the first pinned pattern 112a by the exchange coupling pattern 114a. The fixed magnetization direction of the reference pattern 120a may be the magnetization direction of the second pinned pattern 116a being adjacent to the tunnel barrier pattern 125a. According to example embodiments of inventive concepts, as shown in FIG. 1A, when the reference pattern 120a is disposed below the tunnel barrier pattern 125a, the pining pattern 110a, the first pinned pattern 112a, the exchange coupling pattern 114a, and the second pinned pattern 116a may be sequentially stacked on the first interlayer dielectric layer 102.

The pinning pattern 110a may include an anti-ferromagnetic material. For example, the pinning pattern 110a may include at least one of PtMn, IrMn, MnO, MnS, MnTe, or MnF. The first pinned pattern 112a may include a ferromagnetic material. For example, the first pinned pattern 112a may include at least one of CoFeB, CoFe, NiFe, CoFePt, CoFePd, CoFeCr, CoFeTb, CoFeGd, or CoFeNi. According to example embodiment of inventive concepts, a first magnetic material of the second pinned pattern 116a may include iron (Fe). For example, the first magnetic material of the second pinned pattern 116a may include at least one of CoFeB, CoFe, NiFe, CoFePt, CoFePd, CoFeCr, CoFeTb, CoFeGd, or CoFeNi. When the second pinned pattern 116a may include CoFeTb, the CoFeTb may have a content ratio of terbium (Tb) less than about 10% so that the second pinned pattern 116a may have a magnetization direction parallel to the top surface of the free pattern 130a. Similarly, when the second pinned pattern 116a may include CoFeGd, the CoFeGd may have a content ratio of gadolinium (Gd) less than about 10% so that the second pinned pattern 116a may have a magnetization direction parallel to the top surface of the free pattern 130a. The exchange coupling pattern 114a may include a rare metal. For example, the exchange coupling pattern 114a may include at least one of Ru, Ir, or Rh.

The tunnel barrier pattern 125a may have a thickness less than a spin diffusion distance. The tunnel barrier pattern 125a may include an insulating material. For example, the tunnel barrier pattern 125a may include at least one of magnesium oxide, titanium oxide, aluminum oxide, magnesium-zinc oxide, or magnesium-boron oxide.

The free pattern 130a may have a changeable magnetization direction. That is, by a program operation, the magnetization direction of the free pattern 130a may be changed to a direction parallel or anti-parallel to the magnetization direction of the second pinned pattern 116a. Accordingly, the magnetization direction of the free pattern 130a may be horizontal to the top surface of the substrate 100. By applying a program current through the reference pattern 120a, the tunnel barrier pattern 125a, and the free pattern 130a, the magnetization direction of the free pattern 130a may be changed. The magnetization direction of the free pattern 130a may be changed by spin torques of electrons in the program current.

For example, when the magnetization direction of the free pattern 130a is anti-parallel to that of the second pinned pattern 116a, a program current may be supplied from the free pattern 130a to the reference pattern 120a. That is, electrons in the program current are supplied from the reference pattern 120a to the free pattern 130a. The electrons in the program current may include major electrons and minor electrons. The major electrons may have spins parallel to the magnetization direction of the second pinned pattern 116a and the minor electrons may have spins anti-parallel to the magnetization direction of the second pinned pattern 116a. The major electrons may be accumulated in the free pattern 130a and the magnetization direction of the free pattern 130a may be changed to be parallel to that of the second pinned pattern 116a by spin torques of the accumulated major electrons.

When magnetization directions of the second pinned pattern 116a and the free pattern 130a are parallel to each other, a program current may be supplied from the reference pattern 120a to the free pattern 130a. That is, electrons of the program current are supplied from the free pattern 130a to the reference pattern 120a. Minor electrons anti-parallel to the magnetization direction of the second pinned pattern 116a among electrons in the program current may be reflected by the magnetization direction of the second pinned pattern 116a, and the reflected minor electrons may be accumulated in the free pattern 130a. By spin torques of the accumulated minor electrons, the magnetization direction of the free pattern 130a may be changed to be anti-parallel to that of the second pinned pattern 116a.

The minimum current density to change a magnetization direction of the free pattern 130a is defined as a critical current density. The free pattern 130a may include a second magnetic material. According to example embodiments of inventive concepts, the second magnetic material of the free pattern 130a may include iron (Fe). For example, the second magnetic material of the free pattern 130a may include at least one of CoFeB, CoFe, NiFe, CoFePt, CoFePd, CoFeCr, CoFeTb, CoFeGd, or CoFeNi. When the free pattern 130a may include CoFeTb, the CoFeTb may have a content ratio of terbium (Tb) less than about 10% so that the free pattern 130a may have a magnetization direction horizontal to the top surface of the free pattern 130a. Similarly, when the free pattern 130a may include CoFeGd, the CoFeGd may have a content ratio of gadolinium (Gd) less than about 10% so that the free pattern 130a may have a magnetization direction horizontal to the top surface of the free pattern 130a.

According to example embodiments of inventive concepts, a content ratio of iron (Fe) in the second magnetic material of the free pattern 130a may be equal to or greater than a content ratio of iron (Fe) in the first magnetic material of the second pinned pattern 116a. Accordingly, the MTJ pattern may have improved reliability.

A nonmagnetic metal-oxide pattern 135a may be disposed on the second surface of the free pattern 130a. The nonmagnetic metal-oxide pattern 135a may contact the second surface of the free pattern 130a. According to example embodiments of inventive concepts, as shown in FIG. 1A, the nonmagnetic metal-oxide pattern 135a may be disposed on the top surface of the free pattern 130a. The nonmagnetic metal-oxide pattern 135a may include a nonmagnetic metal and oxygen. A content ratio of the nonmagnetic metal in the nonmagnetic metal-oxide pattern 135a may be greater than a stoichiometric ratio. That is, a content ratio of oxygen in the nonmagnetic metal-oxide pattern 135a may be less than a stoichiometric ratio. For example, the nonmagnetic metal-oxide pattern 135a may include a nonmagnetic metal-rich metal oxide. The nonmagnetic metal-rich metal oxide means a metal oxide in which a content ratio of the nonmagnetic metal is greater than a stoichiometric ratio. An oxygen content ratio in the nonmagnetic metal-rich metal oxide may be less than a stoichiometric ratio. As a result, even if the nonmagnetic metal-oxide pattern 135a is oxide, the nonmagnetic metal-oxide pattern 135a may have a lower resistivity. A concentration of the nonmagnetic metal in the nonmagnetic metal-oxide pattern 135a may be substantially uniform over the entire nonmagnetic metal-oxide pattern 135a, such that entire resistance of the nonmagnetic metal-oxide pattern 135a may be reduced.

The nonmagnetic metal-oxide pattern 135a may apply stress to the free pattern 130a in a direction parallel to the second surface of the free pattern 130a. The stress may be compressive force or tensile force. Accordingly, atomic-magnetic moments non-parallel to the second surface of the free pattern 130a (e.g., the top surface of the substrate 100) may be increased in the free pattern 130a. As a result, the critical current density may be reduced so as to change the magnetization direction of the free pattern 130a. For example, when the free pattern 130a has a positive magnetostriction constant, the nonmagnetic metal oxide layer 135a may provide the compressive force to the second surface of the free pattern 130a, such that atomic-magnetic moments non-parallel to the second surface of the free pattern 130a may be generated in the free pattern 130a. This will be described in more detail with reference to FIG. 1B.

Figure 1B:
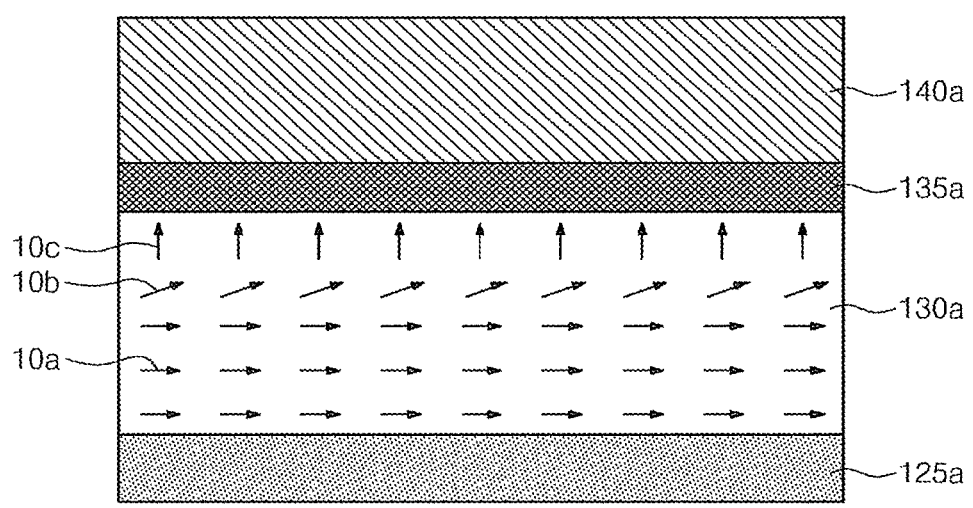
FIG. 1B is an enlarged sectional view of the nonmagnetic metal oxide pattern, the free pattern, and the tunnel barrier pattern of the magnetic memory device shown in FIG. 1A.

FIG. 1B is an enlarged sectional view of the nonmagnetic metal oxide pattern, the free pattern, and the tunnel barrier pattern of the magnetic memory device shown in FIG. 1A Referring to FIG. 1B, the free pattern 130a may include a plurality of atomic-magnetic moments 10a, 10b, and 10c. Since the nonmagnetic metal oxide layer 135a applies stress to the free pattern 130a, at least lattices of a surface portion including the second surface (e.g., the top surface) of the free pattern 130a may be distorted. Accordingly, atomic-magnetic moments non-parallel to the second surface of the free pattern 130a may be generated in the free pattern 130a.

Atomic-magnetic moments that are substantially perpendicular to the second surface, for example, by the nonmagnetic metal-oxide pattern 135a, may be generated in the surface portion including the second surface of the free pattern 130a. Accordingly, an amount of the perpendicular atomic-magnetic moments 10c may be increased in the surface portion including the second surface of the free pattern 130a. Additionally, the atomic-magnetic moments 10b disposed directly below the perpendicular atomic-magnetic moments 10c may be inclined with respect to the second surface of the free pattern 130a because of influence of the perpendicular atomic-magnetic moments 10c of the surface portion. That is, by the nonmagnetic metal-oxide pattern 135a, an amount of the inclined atomic-magnetic moments 10b may be increased. Additionally, the free pattern 130a may include the horizontal atomic-magnetic moments 10a based on the second surface of the free pattern 130a. The magnetization direction of the free pattern 130a may be a net magnetization direction by a vector sum of the atomic-magnetic moments 10a, 10b, and 10c. The magnetization direction of the free pattern 130a may be substantially parallel to the second surface of the free pattern 130a. At least the horizontal atomic-magnetic moments 10a may be changed to be parallel to or anti-parallel to the magnetization direction of the second pinned pattern 116a by a program current.

As mentioned above, since the non-parallel atomic-magnetic moments are generated in the free pattern 130a by the nonmagnetic metal-oxide pattern 135a, an amount of the non-parallel atomic-magnetic moments 10b and 10c may be increased in the free pattern 130a. An amount of the non-parallel atomic-magnetic moments 10b and 10c in the free pattern 130a contacting the nonmagnetic metal-oxide pattern 135a may be greater than that of initial non-parallel atomic-magnetic moments. The amount of the initial non-parallel atomic-magnetic moments means an amount of non-parallel atomic-magnetic moments in the free pattern 130a when the nonmagnetic metal-oxide pattern 135a does not exist on the second surface of the free pattern 130a. That is, the amount of the initial non-parallel atomic-magnetic moments may be that of non-parallel atomic-magnetic moments in the free pattern 130a when lattices of the surface portion including the second surface of the free pattern 130a are not distorted. For example, a portion of the perpendicular atomic-magnetic moments 10c and a portion of the slant atomic-magnetic moments 10b may be included in the amount of the initial non-parallel atomic-magnetic moments.

An amount of the non-parallel atomic-magnetic moments is increased in the free pattern due to the nonmagnetic metal-oxide pattern 135a, such that the critical current density may be reduced. For example, the free pattern 130a may have perpendicular demagnetization energy in a direction perpendicular to the second surface of the free pattern 130a. The perpendicular demagnetization energy may be applied as an energy barrier when the magnetization direction of the free pattern 130a is reversed. The non-parallel atomic-magnetic moments 10b and 10c in the free pattern 130a may reduce the energy barrier. Accordingly, the critical current density for reversing the magnetization direction of the free pattern 130a may be reduced.

Additionally, as mentioned above, since the oxygen content ratio of the nonmagnetic metal-oxide pattern 135a is less than a stoichiometric ratio, the nonmagnetic metal-oxide pattern 135a may have a lower resistivity. Accordingly, a decrease of a magneto resistive (MR) ratio of the MTJ pattern including the reference pattern 120a, the tunnel barrier pattern 125a, and the free pattern 130a may be reduced.

As a result, due to the nonmagnetic metal-oxide pattern 135a, a magnetic memory device having lower power consumption and/or improved reliability may be realized. Additionally, since the critical current density is reduced, sizes of a switching device for controlling the critical current density and/or transistors of a peripheral circuit may be reduced also. Accordingly, a magnetic memory device with a higher degree of integration may be realized.

According to example embodiments of inventive concepts, the magnetic material in the free pattern 130a may include iron (Fe) and cobalt (Co). In example embodiments, a content ratio of iron (Fe) in the free pattern 130a may be greater than a content ratio of cobalt (Co) in the free pattern 130a. Due to this, an amount of the non-parallel atomic-magnetic moments generated in the free pattern 130a by the nonmagnetic metal-oxide pattern 135a may be increased. When the free pattern 130a includes Fe and Co, the free pattern 130a may include at least one of CoFeB, CoFe, NiFe, CoFePt, CoFePd, CoFeCr, CoFeTb, CoFeGd, or CoFeNi. When the free pattern 130a may include CoFeTb, the CoFeTb may have a content ratio of terbium (Tb) less than about 10% so that the free pattern 130a may have a magnetization direction horizontal to the top surface of the free pattern 130a. Similarly, when the free pattern 130a may include CoFeGd, the CoFeGd may have a content ratio of Gd less than about 10% so that the free pattern 130a may have a magnetization direction horizontal to the top surface of the free pattern 130a.

According to example embodiments of inventive concepts, the free pattern 130a may have a thickness for including the non-parallel atomic-magnetic moments 10b and 10c and the parallel atomic-magnetic moments 10a. For example, the free pattern 130a may have the thickness of about 20 Å and about 50 Å. However, inventive concepts are not limited thereto. The free pattern 130a may be thinner than about 20 Å or thicker than about 50 Å.

Referring to FIG. 1A, the nonmagnetic-oxide pattern 135a may have a substantially uniform thickness. The nonmagnetic metal-oxide pattern 135a may have a thin thickness. According to example embodiments of inventive concepts, the nonmagnetic metal-oxide pattern 135a may have a thickness of about 2 Å to about 20 Å. According to example embodiments of inventive concepts, the nonmagnetic metal-oxide pattern 135a may be in an amorphous state. According to example embodiments of inventive concepts, the nonmagnetic metal-oxide pattern 135a may include at least one of hafnium-rich hafnium oxide, tantalum-rich tantalum oxide, zirconium-rich oxide, chromium-rich chromium oxide, vanadium-rich vanadium oxide, molybdenum-rich molybdenum oxide, titanium-rich titanium oxide, tungsten-rich tungsten oxide, yttrium-rich yttrium oxide, magnesium-rich magnesium oxide, or zinc-rich zinc oxide.

According to example embodiments of inventive concepts, the nonmagnetic metal-oxide pattern 135a need not be a nonmagnetic metal-oxide, but may also be a non-magnetic metal nitride. For example, the pattern 135a may include at least one of a hafnium nitride, a tantalum nitride, a zirconium nitride, a chrome nitride, a vanadium nitride, a molybdenum nitride, a titanium nitride, a tungsten nitride, an yttrium nitride, a magnesium nitride, or a zinc nitride. According to example embodiments of inventive concepts, a content ratio of a nonmagnetic metal in the nonmagnetic metal nitride may be greater than a stoichiometric ratio.

According to example embodiments of inventive concepts, when the free pattern 130a includes CoFeB, the nonmagnetic metal-oxide pattern 135a may apply compression force to the second surface of the free pattern 130a, such that the non-parallel atomic-magnetic moments may be increased in the free pattern 130a. According to example embodiments of inventive concepts, the nonmagnetic metal-oxide pattern 135a may include tantalum-rich oxide tantalum. For example, a stoichiometric ratio of the oxide tantalum may be $Ta_2O_5$. A content ratio of Ta in the tantalum-rich oxide tantalum may be greater than about 29% and less than about 100%.

A passivation pattern 140a may be disposed on the nonmagnetic metal-oxide pattern 135a. The nonmagnetic metal-oxide pattern 135a may be disposed between the passivation pattern 140a and the free pattern 130a. The passivation pattern 140a may be formed of a conductive material. For example, the passivation pattern 140a may include metal. For example, the passivation pattern 140a may include at least one of Ru, Ta, Pd, Ti, Pt, Ag, Au, or Cu.

A first electrode 105a may be disposed between the reference pattern 120a and the first interlayer dielectric layer 102. A second electrode 145a may be disposed on the passivation pattern 140a. The first electrode 105a may contact the top surface of the lower contact plug 104. The first and second electrodes 105a and 145a may include a conductive material having a suitable barrier property. For example, the first and second electrodes 105a and 145a may include a conductive metal nitride. For example, the first and second electrodes 105a and 145a may include at least one of titanium nitride, tantalum nitride, tungsten nitride, or titanium aluminum nitride. The first and second electrode 105a and 145a may be formed of the same material to each other or different materials from each other. However, inventive concepts are not limited thereto. For example, the first electrode 105a may perform another function or may be formed of another material.

A second interlayer dielectric layer 150 may be disposed on the entire surface of the substrate 100 including the second electrode 145a. An upper contact plug 152 may penetrate the second interlayer dielectric layer 150 so as to contact the second electrode 145a. Interconnections 155 may be disposed on the second interlayer dielectric layer 150 to contact the upper contact plug 152. The interconnections 155 may correspond to a bit line. The upper contact plug 152 may include at least one of metals (e.g., titanium, tantalum, copper, aluminum, or tungsten and so on) or conductive metal nitrides (e.g., titanium nitride, tantalum nitride and so on). The interconnections 155 may include at least one of metals (e.g., titanium, tantalum, copper, aluminum, or tungsten and so on) or conductive metal nitrides (e.g., titanium nitride, tantalum nitride and so on).

Next, modifications of example embodiments will be described with reference to the drawings.

Figure 2A:
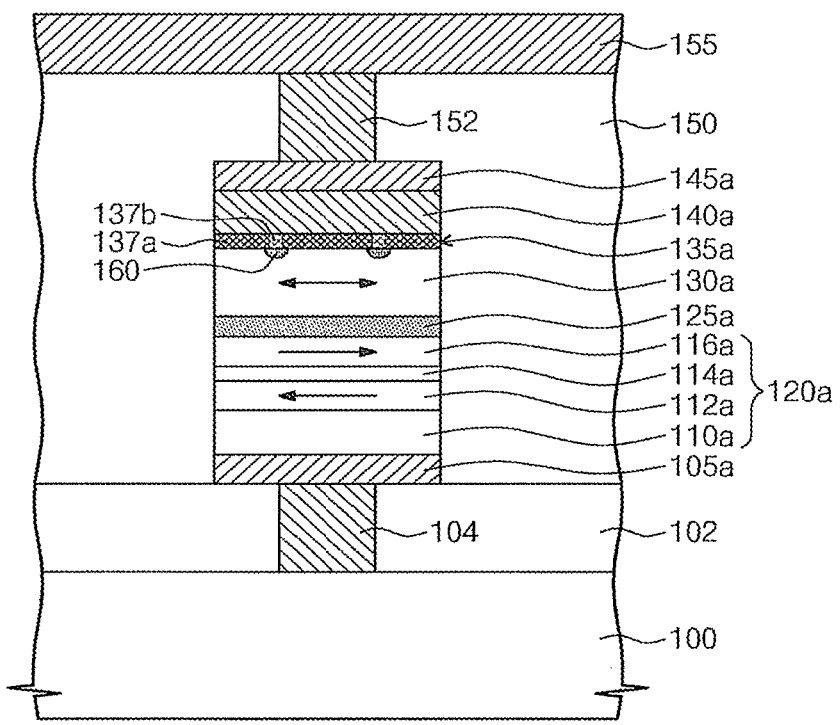
FIG. 2A is a sectional view illustrating a modification of a magnetic memory device according to example embodiments of inventive concepts.

FIG. 2A is a sectional view illustrating a modification of a magnetic memory device according to example embodiments of inventive concepts.

Referring to FIG. 2A, as mentioned above, the free pattern 130a may have a first surface adjacent to the tunnel barrier pattern 125a and a second surface opposite to the first surface. As shown in FIG. 2A, the first and second surfaces of the free pattern 130a may corresponding to the bottom and top surfaces of the free pattern 130a, respectively. A surface local region 160 may be partially formed on the second surface (e.g., the top surface) of the free pattern 130a. The partially forming of the surface local region 160 on the second surface of the free pattern 130a may mean that the surface local region 160 is formed on a portion of the second surface of the free pattern 130a and a surface portion including the portion of the second surface. The top surface of the surface local region 160 may be substantially coplanar to the second surface of the free pattern 130a. The surface local region 160 may include a material different from the free pattern 130a. According to example embodiments of inventive concepts, the surface local region 160 may include an oxide formed by oxidizing a portion of the free pattern 130a. Therefore, the surface local region 160 may include an oxide having oxygen element and the same elements as elements in the free pattern 130a.

A nonmagnetic metal-oxide pattern 135a' may contact the second surface of the free pattern 130a. The nonmagnetic metal-oxide pattern 135a' may be partially in a crystalline state. That is, the nonmagnetic metal-oxide pattern 135a' may include a first portion 137a of an amorphous state and a second portion 137b of a crystalline state. The surface local region 160 may be disposed directly below the second portion 137b of the nonmagnetic metal-oxide pattern 135a'. The surface local region 160 may contact the nonmagnetic metal-oxide pattern 135a'. The surface local region 160 may contact the second portion 137b of the nonmagnetic metal-oxide pattern 135a'. The nonmagnetic metal-oxide pattern 135a' may have the same characteristics and may be formed of the same material as the nonmagnetic metal-oxide pattern 135a described with reference to FIGS. 1A and 1B.

Due to the surface local region 160 including a material different from the free pattern 130a, atomic-magnetic moments non-parallel to the second surface of the free pattern 130a may be generated in a portion of the free pattern 130a adjacent to the surface local region 160. Accordingly, a critical current density required to reverse a magnetization direction of the free pattern 130a may be reduced by the non-parallel atomic-magnetic moments generated by the nonmagnetic metal-oxide pattern 135a' and the non-parallel atomic-magnetic moments generated by the surface local region 160. As a result, a magnetic memory device improved or optimized for lower power consumption and/or higher degree of integration may be realized FIG. 2B is a sectional view illustrating another modification a magnetic memory device according to example embodiments of inventive concepts.

Figure 2B:
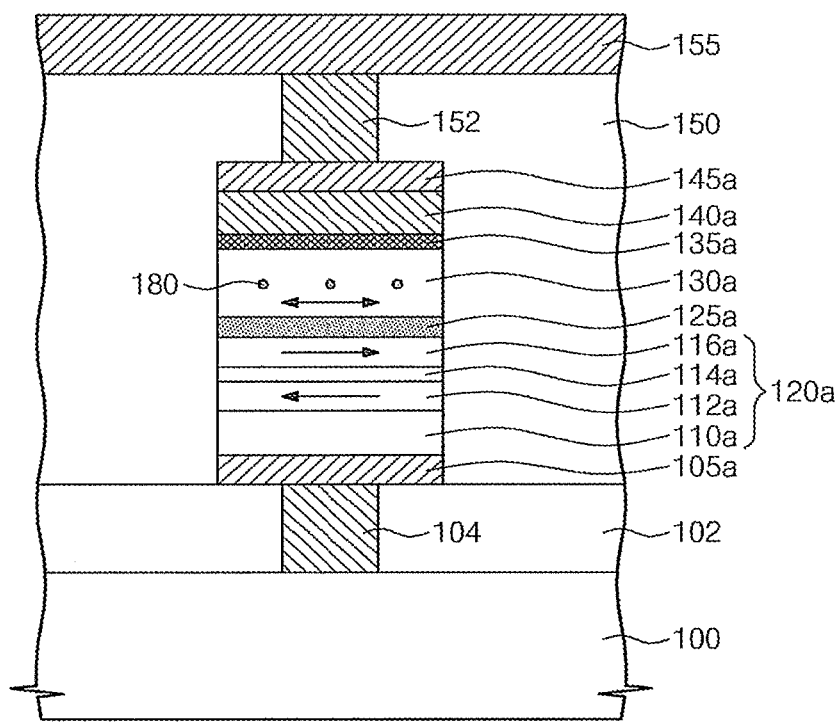
FIG. 2B is a sectional view illustrating another modification a magnetic memory device according to example embodiments of inventive concepts.

Referring to FIG. 2B, according to example embodiments, at least one particle 180 may be disposed within the free pattern 130a. The particle 180 may include a material different from the free pattern 130a. According to example embodiments, the particle 180 may include at least one of a nonmagnetic material, an oxide of a nonmagnetic material, a nitride of a nonmagnetic material, an oxide of a magnetic material, or a nitride of a magnetic material. For example, the particle 180 may include at least one of tantalum, zinc, hafnium, zirconium, magnesium, titanium, chrome, copper, an oxide thereof, a nitride thereof, an oxide of a magnetic material (e.g., an iron-nickel oxide, a cobalt-iron oxide and so on), or a nitride of a magnetic material (e.g., an iron-nickel nitride, a cobalt-iron oxide and so on). The particle 180 may be spaced apart from the first and second surfaces (e.g., the top and bottom surfaces) of the free pattern 130a. That is, the particle 180 may be disposed at a given or predetermined depth from the top surface of the free pattern 130a and also may be disposed at a given or predetermined level from the bottom surface of the free pattern 130a.

Since the particle 180 includes a material different from the free pattern 130a, atomic-magnetic moments non-parallel to the first and second surfaces of the free pattern 130a may be generated in the free pattern 130a around the particle 180. Accordingly, the critical current density may be reduced by the non-parallel atomic-magnetic moments generated by the particles 180 and the nonmagnetic metal-oxide pattern 135a, such that a magnetic memory device improved or optimized for lower power consumption and/or higher degree of integration may be realized.

According to example embodiments of inventive concepts, the free pattern 130a may include both the surface local region 160 of FIG. 2A and the particle 180 of the FIG. 2B.

In addition, according to the magnetic memory device described with reference to FIG. 1A, the reference pattern 120a, the tunnel barrier pattern 125a, and the free pattern 130a may be sequentially stacked on the first interlayer dielectric layer 102. Unlike this, the patterns 120a, 125a, and 130a may be stacked in a different order. This will be described with reference to the drawings.

Figure 2C:
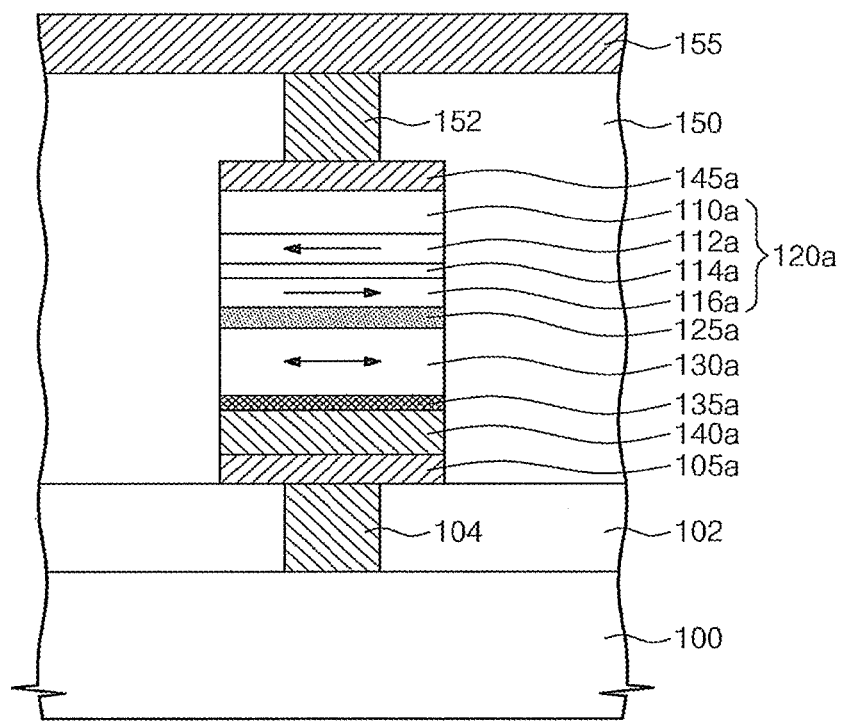
FIG. 2C is a sectional view illustrating further another modification of a magnetic memory device according to example embodiments of inventive concepts.

FIG. 2C is a sectional view illustrating further another modification of a magnetic memory device according to example embodiments of inventive concepts.

Referring to FIG. 2C, a first electrode 105a, a free pattern 130a, a tunnel barrier pattern 125a, a reference pattern 120a, and a second electrode 145a may be sequentially stacked on a first interlayer dielectric layer 102. In example embodiments, the first surface contacting the tunnel barrier pattern 125a of the free pattern 130a may correspond to the top surface of the free pattern 130a, and the second surface opposite to the first surface of the free pattern 130a may correspond to the bottom surface of the free pattern 130a. In example embodiments, the nonmagnetic metal-oxide pattern 135a may be disposed between the free pattern 130a and the first electrode 105a, and may contact the bottom surface of the free pattern 130a. A passivation pattern 140a may be disposed between the first electrode 105a and the nonmagnetic metal-oxide pattern 135a. According to example embodiments of inventive concepts, the passivation pattern 140a may be omitted. According to this modification, a second pinned pattern 116a, an exchange coupling pattern 114a, a first pinned pattern 112a, and a pinned pattern 110a may be sequentially stacked on the tunnel barrier pattern 125a. As shown in FIG. 2C, the free pattern 130a may include the particles 180 shown in FIG. 2B.

Figure 2D:
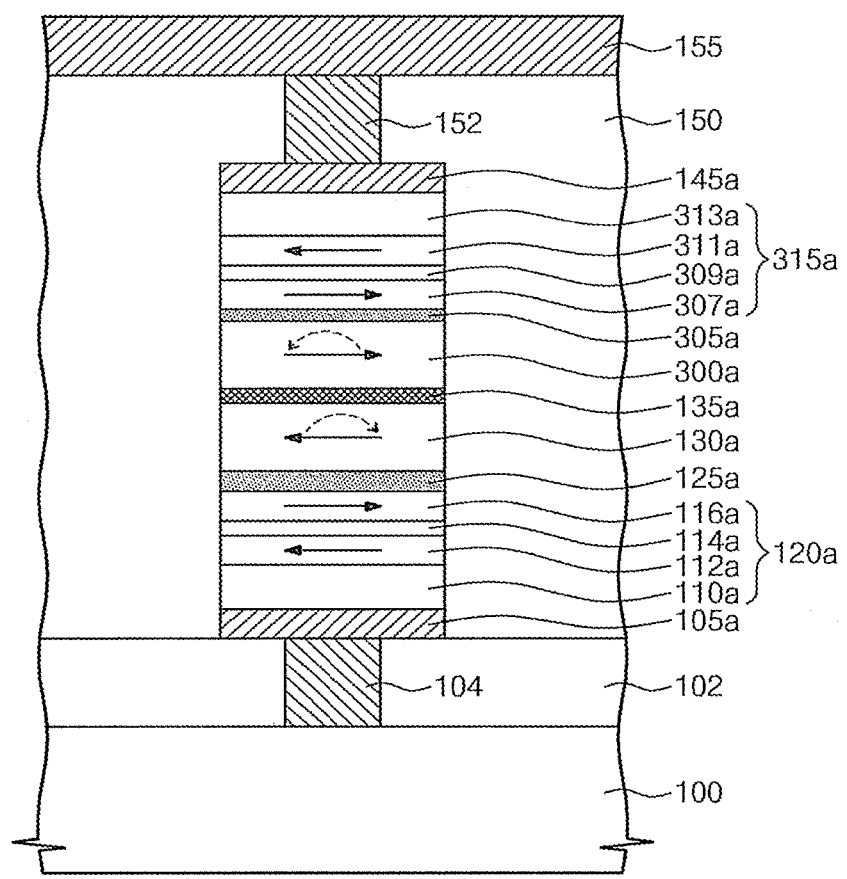
FIG. 2D is a sectional view illustrating further another modification of a magnetic memory device according to example embodiments of inventive concepts.

FIG. 2D is a sectional view illustrating another modification of a magnetic memory device according to example embodiments of inventive concepts. An MTJ pattern of the magnetic memory device according to this modification may include two free patterns, two tunnel barrier patterns, and two reference patterns. As described below, the reference pattern 120a, the tunnel barrier pattern 125a, and the free pattern 130a of FIG. 1A may correspond to the first reference pattern 120a, the first tunnel barrier pattern 125a, and the first free pattern 130a, respectively.

Referring to FIG. 2D, a first electrode 105a may be disposed on a first interlayer dielectric layer 102. A first reference pattern 120a, a first tunnel barrier pattern 125a, and a first free pattern 130a may be sequentially stacked on the first electrode 105a. A nonmagnetic metal-oxide pattern 135a may be disposed on the first free pattern 130a. A second free pattern 300a, a second tunnel barrier pattern 305a, and a second reference pattern 315a may be sequentially disposed on the nonmagnetic metal-oxide pattern 135a. The MTJ pattern may include the first reference pattern 120a, the first tunnel barrier pattern 125a, the first free pattern 130a, the nonmagnetic metal-oxide pattern 135a, the second free pattern 300a, the second tunnel barrier pattern 305a, and the second reference pattern 315a.

The second free pattern 300a may have a first surface and a second surface opposite to each other. The first surface of the second free pattern 300a may contact the second tunnel barrier pattern 305a and the second surface of the second free pattern 300a may contact the nonmagnetic metal-oxide pattern 135a. The first and second surfaces of the second free pattern 300a may correspond to the top and bottom surfaces of the second free pattern 300a, respectively. The first and second surfaces of the second free pattern 300a may be horizontal to the top surface of the substrate 100. As described with reference to FIG. 1A, the first surface of the first free pattern 130a may be adjacent to the first tunnel barrier pattern 125a and the second surface of the second free pattern 130a may contact the nonmagnetic metal-oxide pattern 135a. Accordingly, the nonmagnetic metal-oxide pattern 135a may be disposed between the second surface (e.g., the top surface) of the first free pattern 130a and the second surface (e.g., the bottom substrate) of the second free pattern 300a. For example, the bottom and top surfaces of the nonmagnetic metal-oxide pattern 135a may contact the second surface (e.g., the top surface) of the first free pattern 130a and the second surface (e.g., the bottom surface) of the second free pattern 300a, respectively. Since the nonmagnetic metal-oxide pattern 135a contacts the second free pattern 300a, atomic-magnetic moments non-parallel to the second surface of the second free pattern 300a may be increased in the second free pattern 300a. Accordingly, a critical current density may be reduced.

The second free pattern 300a may have a magnetization direction, which is changeable and parallel to the first and second surfaces of the first free pattern 130a. As shown in the drawings, the magnetization direction of the second free pattern 300a may be anti-parallel to the magnetization direction of the first free pattern 130a. This may be caused by a magnetostatic field or a stray field generated from the first and second free patterns 130a and 300a. The second free pattern 300a may be formed of the same magnetic material as the first free pattern 130a. The second tunnel barrier pattern 305a may include at least one of magnesium oxide, titanium oxide, aluminum oxide, magnesium-zinc oxide, or magnesium-boron oxide. An electrical resistance of the first tunnel barrier pattern 125a may be different from that of the second tunnel barrier pattern 305a. Accordingly, since the first magnetic resistance ratio by the first reference pattern 120a, a first tunnel barrier pattern 125a, and the first free pattern 130a becomes different from a second magnetic resistance ratio by the second reference pattern 315a, the second tunnel barrier pattern 305a, and the second free pattern 300a, such that logic data may be written in the MTJ pattern including the first and second free patterns 130a and 305a or the logic data stored in the MTJ pattern may be read. For example, when the first and second tunnel barrier patterns 125a and 305a are formed of the same material, as shown in the drawings, the first tunnel barrier pattern 125a may have a thickness different from the second tunnel barrier pattern 305a. According to example embodiments of inventive concepts, the first tunnel barrier pattern 125a may have a dielectric material having a lower resistivity than the second tunnel barrier pattern 305a. Therefore, an electrical resistance of the first tunnel barrier pattern 125a and an electrical resistance of the second tunnel barrier pattern 305a may be adjusted differently by adjusting the thicknesses of the first and second tunnel barrier patterns 125a and 305a and/or the resistivities of the dielectric materials included in the first and second tunnel barrier patterns 125a and 305a. According to example embodiments of inventive concepts, when the first and second tunnel barrier patterns 125a and 305a may be formed of the same material and the first tunnel barrier pattern 125a may be thicker than the second tunnel barrier pattern 305a, the first free pattern 130a may substantially be a storage element for storing logic data.

The second reference pattern 315a may include a pinning pattern 313a, a first pinned pattern 311a, an exchange coupling pattern 309a, and a second pinned pattern 307a. A first pinned pattern 311a of the second reference pattern 315a may be disposed between the pinning pattern 313a and the second tunnel barrier pattern 305a, and a second pinned pattern 307a of the second reference pattern 315a may be disposed between the first pinned pattern 311a and the second tunnel barrier pattern 305a. The exchange coupling pattern 309a of the second reference pattern 315a may be disposed between the first and second pinned patterns 311a and 307a. The first pinned pattern 311a of the second reference pattern 315a may contact the pinning pattern 313a, and the second pinned pattern 307a of the second reference pattern 315a may contact the top surface of the second tunnel barrier pattern 305a. The magnetization direction of the first pinned pattern 311a of the second reference pattern 315a may have a fixed magnetization direction by the pinning pattern 313a. The magnetization direction of the first pinned pattern 311a of the second reference pattern 315a may be substantially parallel to the first and second surfaces of the first free pattern 130a. The magnetization direction of the second pinned pattern 307a of the second reference pattern 315a may be fixed in anti-parallel to the magnetization direction of the first pinned pattern 311a by the exchange coupling pattern 309a.

The pinning pattern 313a of the second reference pattern 315a may include an anti-ferromagnetic material. For example, the pinning pattern 313a of the second reference pattern 315a may include at least one of PtMn, IrMn, MnO, MnS, MnTe, or MnF. The first pinned pattern 311a of the second reference pattern 315a may include a ferromagnetic material. For example, the first pinned pattern 311a of the second reference pattern 315a may include at least one of CoFeB, CoFe, NiFe, or CoFeNi. The exchange coupling pattern 309a of the second reference pattern 315a may include a rare metal. For example, the exchange coupling pattern 309a of the second reference pattern 315a may include at least one of Ru, Ir, or Rh.

The second electrode 145a may be disposed on the second reference pattern 315a. According to this modification, the passivation pattern 140a of FIG. 1A may be omitted.

According to example embodiments of inventive concepts, as shown in FIG. 2D, the second pinned pattern 116a of the first reference pattern 120a adjacent to the first tunnel barrier pattern 125a may have a magnetization direction parallel to a magnetization direction of the second pinned pattern 307a of the second reference pattern 315a adjacent to the second tunnel barrier pattern 305a. After applying heat of a higher temperature than a blocking temperature of the pinning patterns 110a and 313a and then providing external magnetization, magnetization directions of the second pinned patterns 116a and 307a of the first and second reference patterns 120a and 315a may be arranged to be in parallel. The blocking temperature may be a critical temperature at which anti-ferromagnetic materials in the pinning patterns 110a and 313a may lose their properties. For example, when the heat of a higher temperature than the blocking temperature is applied, atomic-magnetic moments in the anti-ferromagnetic materials may be arranged in a random direction.

An operation method of the magnetic memory device will be described. During one program operation, a program current from the second electrode 145a to the first electrode 105a may be provided. In example embodiments, electrons in the program current may transfer from the first electrode 105a to the second electrode 145a. The electrons in the program current may penetrate the second pinned pattern 116a of the first reference pattern 120a. The electrons penetrating the second pinned pattern 116a of the first reference pattern 120a may include major electrons and minor electrons. The major electrons may have spins parallel to the magnetization direction of the second pinned pattern 116a of the first reference pattern 120a and the minor electrons may have spins anti-parallel to the magnetization direction of the second pinned pattern 116a of the first reference pattern 120a. The major electrons may be accumulated in the first free pattern 130a, thereby reversing the magnetization direction of the first free pattern 130a. The magnetization direction of the second free pattern 300a may be coupling to the magnetization direction of the first free pattern 130a by the magnetostatic field or the stray field, such that the magnetization direction of the second free pattern 300a may be reversed when the magnetization direction of the first free pattern 130a is reversed. The magnetization directions of the second pinned patterns 116a and 307a of the first and second reference patterns 120a and 315a are parallel to each other, such that the minor electrons may be reflected by the magnetization direction of the second reference pattern 315a after penetrating the nonmagnetic metal-oxide pattern 135a and the second free pattern 300a. The reflected minor electrons may be accumulated in the second free pattern 300a, thereby helping the magnetization direction of the second free pattern 300a to be reversed. As a result, the magnetization directions of the first and second free patterns 130a and 300a combined in an anti-parallel direction can be reversed by the major electrons penetrating the second pinned pattern 116a of the first reference pattern 120a and the minor electrons reflected to the second pinned pattern 307a of the second reference pattern 315a. Accordingly, a critical current density may be reduced.

According to example embodiments of inventive concepts, a program current may be supplied from the first electrode 105a to the second electrode 145a. In example embodiments, major electrons penetrating the second pinned pattern 307a of the second reference pattern 315a may be accumulated in the second free pattern 300a such that they contribute to reversing the magnetization direction of the second free pattern 300a and also minor electrons reflected to the second pinned pattern 116a of the first reference pattern 120a may be accumulated in the first free pattern 130a such that they contribute to reversing the magnetization direction of the first free pattern 130a. In example embodiments, the major electrons penetrating the second pinned pattern 307a of the second reference pattern 315a may have spins parallel to the magnetization direction of the second pinned pattern 307a of the second reference pattern 315a, and the minor electrons reflected to the second pinned pattern 116a of the first reference pattern 120a may have spins anti-parallel to the magnetization direction of the second pinning pattern 116a.

As a result, according to this modification, an amount of non-parallel atomic-magnetic moments in the first and second free patterns 130a and 300a is increased by the nonmagnetic metal-oxide pattern 135a, so that the critical current density may be reduced. Additionally, during one program operation, the major electrons penetrating the second pinned patterns 116a of the first reference pattern 120a and the minor electrons reflected to the second pinned pattern 307a of the second reference pattern 315a are all used to reverse the magnetization directions of the first and second free patterns 130a and 300a. As a result, a critical current density may be further reduced.

According to example embodiments of inventive concepts, the first free pattern 130a of FIG. 2D may include the surface local region shown in FIG. 2A and/or the particles 180 shown in FIG. 2B. According to example embodiments of inventive concepts, the second free pattern 300a may include particles 180 shown in FIG. 2B.

Next, a method of manufacturing a magnetic memory device according to example embodiments will be described with reference to the drawings.

FIGS. 3A through 3D are sectional views illustrating a method of manufacturing a magnetic memory device according to example embodiments of inventive concepts.

Figure 3A:
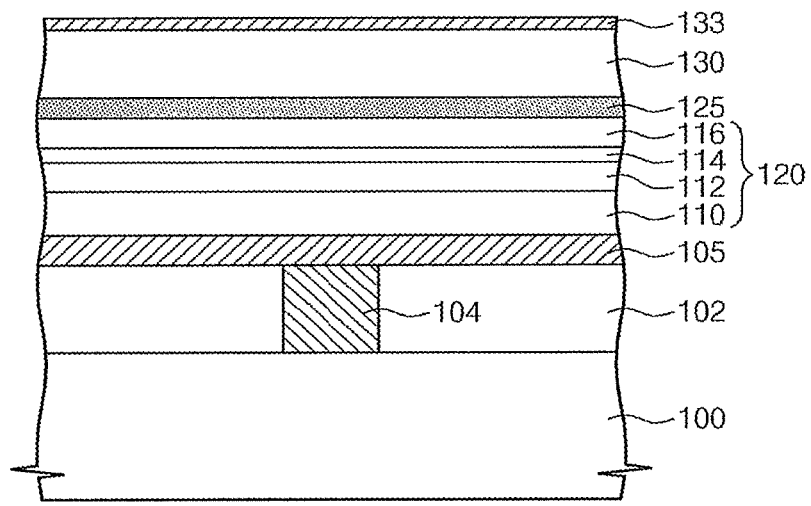
FIGS. 3A through 3D are sectional views illustrating a method of manufacturing a magnetic memory device according to example embodiments of inventive concepts.

Referring to FIG. 3A, a first interlayer dielectric layer 102 may be formed on a substrate 100 and a lower contact plug 104 penetrating the first interlayer dielectric layer 102 may be formed. Next, a first electrode conductive layer 105, a reference layer 120, a tunnel barrier layer 125, and/or a free layer 130 may be sequentially formed on the first interlayer dielectric layer 102. The reference layer 120 may include a pinning layer 110, a first pinned layer 112, an exchange coupling layer 114, and/or a second pinned layer 116, which are sequentially stacked.

A nonmagnetic metal layer 133 may be formed on the free layer 130. The nonmagnetic metal layer 133 may be formed by a sputtering process. Alternatively, the nonmagnetic metal layer 133 may be formed through a chemical vapor deposition (CVD) process or an atomic layer deposition (ALD) process.

Figure 3B:
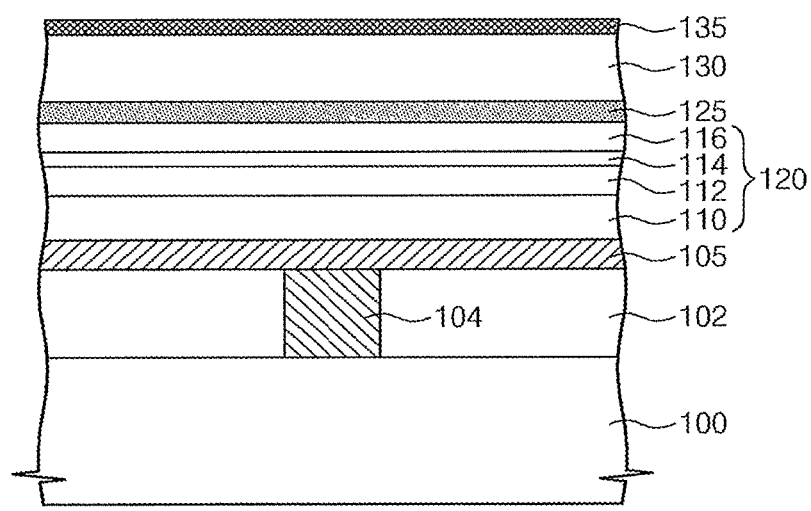

Referring to FIG. 3B, a nonmagnetic metal oxide layer 135 may be formed by oxidizing the nonmagnetic metal layer 133. The nonmagnetic metal layer 133 may be oxidized by a natural oxidation, a radical oxidation process or a plasma oxidation process. In example embodiments, oxygen amount supplied to the nonmagnetic metal layer 133 may be less than a stoichiometric ratio. Accordingly, the nonmagnetic metal oxide layer 135 may be formed of a nonmagnetic metal-rich metal oxide. According to example embodiments of inventive concepts, the nonmagnetic metal oxide layer 135 may be thinly formed with a thickness of about 2 Å to about 20 Å.

The nonmagnetic metal oxide layer 135 may be formed by other methods. For example, the nonmagnetic metal oxide layer 135 may be formed by a CVD process or an ALD process. In example embodiments, a supply amount of metal source gas and a supply amount of oxygen source gas may be adjusted to increase a content ratio of a nonmagnetic metal in the nonmagnetic metal oxide layer 135 to be higher than a stoichiometric ratio. For example, a supply amount of a metal source may be increased and an amount of oxygen source gas may be decreased.

Figure 3C:
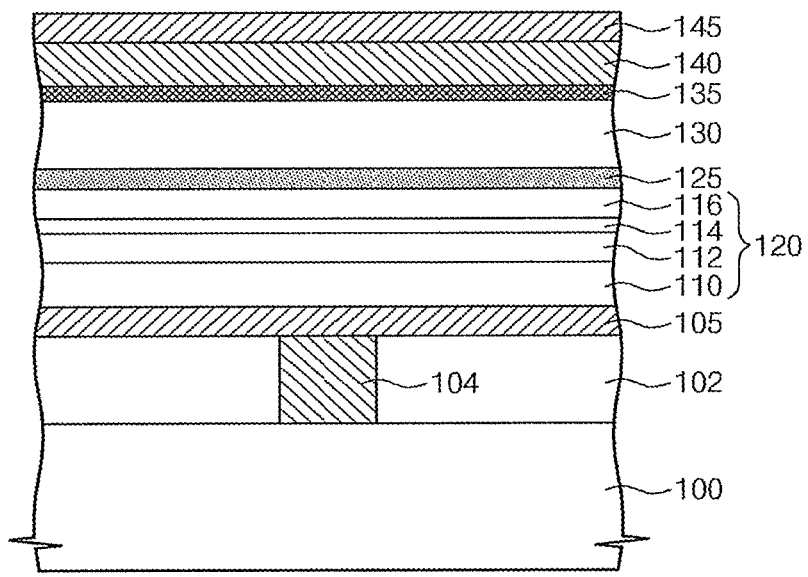
Figure 3D:
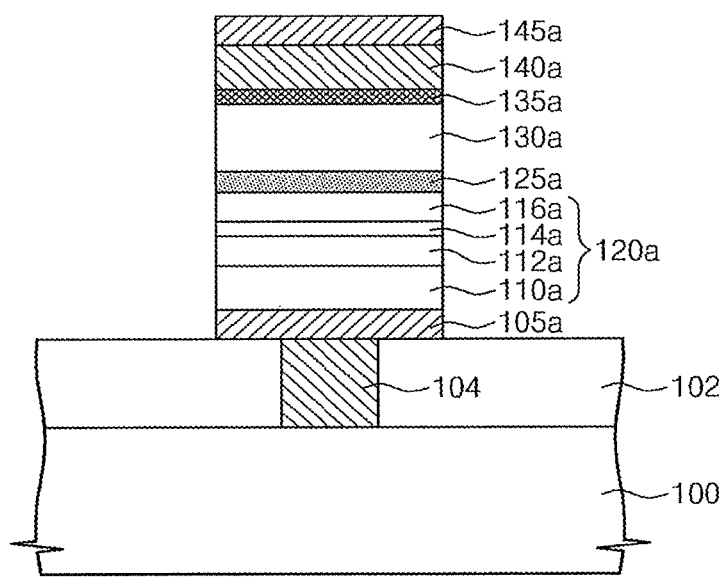

Referring to FIGS. 3C and 3D, a passivation layer 140 and a second electrode conductive layer 145 may be sequentially formed on the nonmagnetic metal oxide layer 135. Next, the second electrode conductive layer 145, the passivation layer 140, the nonmagnetic metal oxide layer 135, the free layer 130, the tunnel barrier layer 125, the reference layer 120, and the first electrode conductive layer 105 may be sequentially patterned. Accordingly, as shown in FIG. 3D, the sequentially stacked first electrode 105a, reference pattern 120a, tunnel barrier pattern 125a, free pattern 130a, nonmagnetic metal-oxide pattern 135a, passivation pattern 140a, and second electrode conductive layer 145 may be formed on the first interlayer dielectric layer 102.

Next, the second interlayer dielectric layer 150, the upper contact plug 152, and the interconnection 155 of FIG. 1A may be sequentially formed. Therefore, the magnetic memory device of FIG. 1A is produced.

Next, a method of manufacturing the magnetic memory device shown in FIG. 2A will be described. During description of the manufacturing method, overlapping description will be omitted for convenience.

Figure 4A:
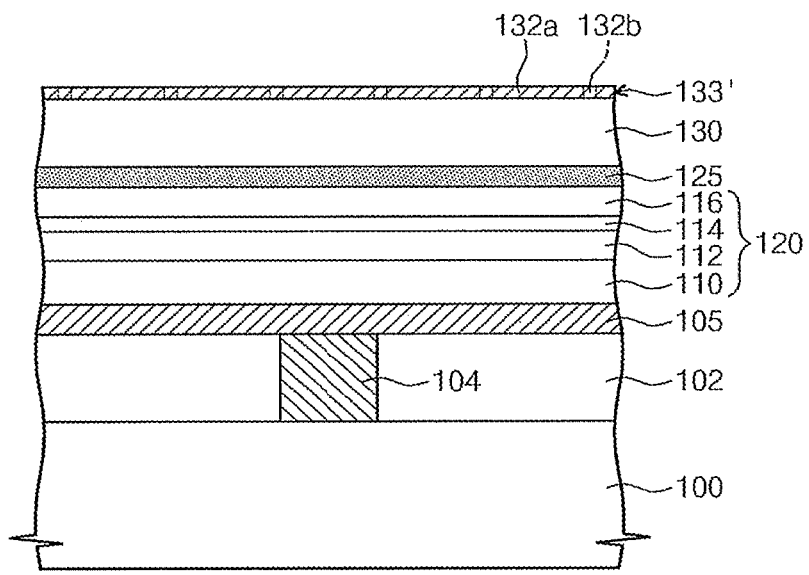
FIGS. 4A and 4B are sectional views illustrating a modification of a method of manufacturing a magnetic memory device according to example embodiments of inventive concepts.
Figure 4B:
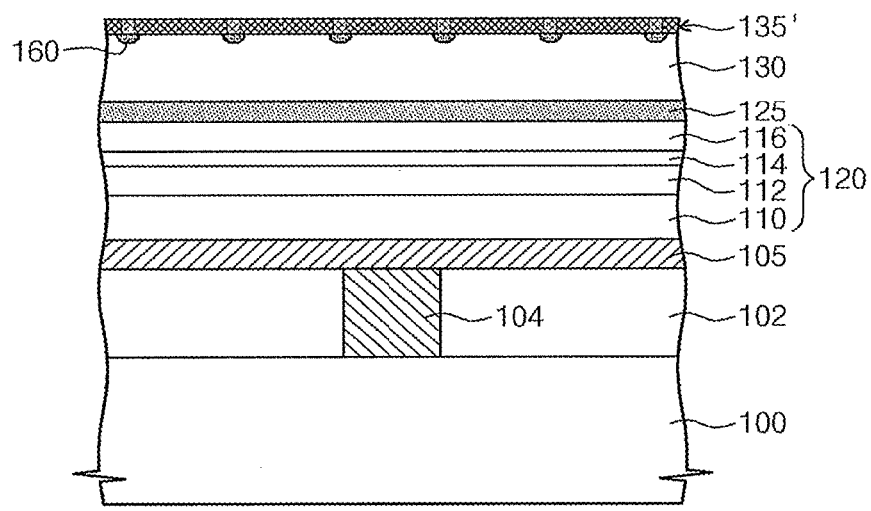

FIGS. 4A and 4B are sectional views illustrating a modification of a method of manufacturing a magnetic memory device according to example embodiments of inventive concepts.

Referring to FIG. 4A, a nonmagnetic metal layer 133' may be formed on a free layer 130. The nonmagnetic metal layer 133' may include a first portion 132a of an amorphous state and a second portion 132b of a crystalline state. The nonmagnetic metal layer 133' may be formed through a sputtering process. When the nonmagnetic metal layer 133' is deposited through a sputtering process, it may be partially in a crystalline state. According to example embodiments of inventive concepts, after the nonmagnetic metal layer 133' is deposited through a sputtering process, an annealing process may be performed on the nonmagnetic metal layer 133' such that nonmagnetic metal layer 133' may be partially in a crystalline state.

Referring to FIGS. 4A and 4B, a nonmagnetic metal oxide layer 135' may be formed by oxidizing the nonmagnetic metal layer 133'. An oxidation speed of the first portion 132a in the amorphous state may be different from that of the second portion 132b in the crystalline state. The oxidation speed of the second portion 132b in the crystalline state may be faster than that of the first portion 132a in the amorphous state. Accordingly, a portion of the top surface of the free layer 130 may be oxidized by oxygen supplied through the second portion 132b. As a result, a surface local region 160 may be partially formed on the top surface of the free layer 130. A content ratio of a nonmagnetic metal in the nonmagnetic metal oxide layer 135' may be higher than a stoichiometric ratio. The nonmagnetic metal oxide layer 135' may include a first portion of an amorphous state and a second portion of a crystalline state. That is, the first portion 132a of the nonmagnetic metal layer 133' is oxidized such that it may be formed as a first portion (of an amorphous state) of the nonmagnetic metal oxide layer 135' and the second portion 132b of the nonmagnetic metal layer 133' is oxidized such that it may be formed as a second portion (of a crystalline state) of the nonmagnetic metal oxide layer 135'. A method below will be performed as described with reference to FIGS. 3C and 3D.

Next, a manufacturing method of the magnetic memory device of FIG. 2B will be described.

Figure 5A:
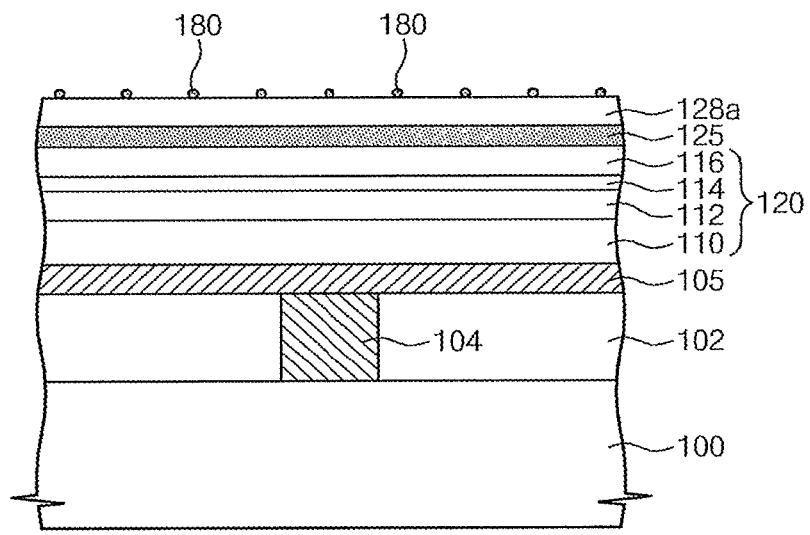
FIGS. 5A and 5B are sectional views illustrating another modification of a method of manufacturing a magnetic memory device according to example embodiments of inventive concepts.
Figure 5B:
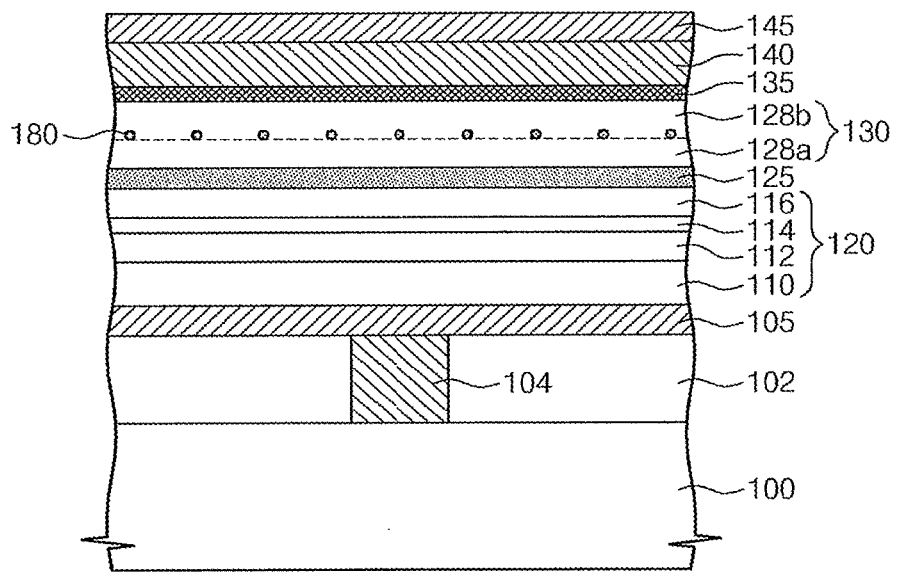

FIGS. 5A and 5B are sectional views illustrating another modification of a method of manufacturing a magnetic memory device according to example embodiments of inventive concepts.

Referring to FIG. 5A, a first sub magnetic layer 128a may be formed on a tunnel barrier layer 125. The first sub magnetic layer 128a may be formed of the same material as the free pattern 130a described with reference to FIG. 1A. At least one particle 180 may be formed on the first sub magnetic layer 128a. The particle 180 may be formed through a sputtering process. The particles 180 are spaced apart from each other on the first sub magnetic layer 128a.

Referring to FIG. 5B, a second sub magnetic layer 128b may be formed on the first sub magnetic layer 128a and the particle 180. Accordingly, the particles 180 may be surrounded by the first and second sub magnetic layers 128a and 128b. The second sub magnetic layer 128b may be formed of the same magnetic material as the first sub magnetic layer 128a. The first and second sub magnetic layers 128a and 128b may be included in the free layer 130. Accordingly, the particle 180 may be disposed in the free layer 130.

The free layer 130 including the particle 180 may be formed through another method. This will be described with reference to a flowchart of FIG. 5C.

Figure 5C:
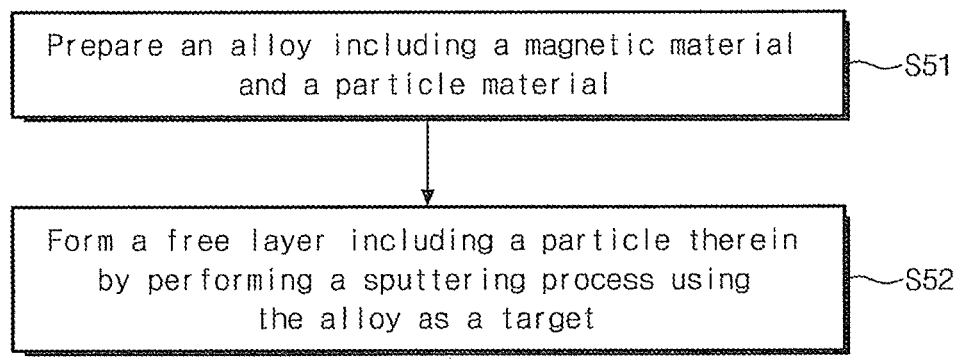
FIG. 5C is a flowchart illustrating a method of manufacturing the free layer of FIG. 5B according to example embodiments of inventive concepts.

FIG. 5C is a flowchart illustrating another method of manufacturing the free layer of FIG. 5B.

Referring to FIG. 5C, an alloy including a magnetic material and a particle material may be prepared (S51). The alloy may include a magnetic material included in the free pattern 130a described with reference to FIG. 1A and a particle material included in the particle 180 described with reference to FIG. 2B. A content ratio of the magnetic material in the alloy may be far higher than that of the particle material. A free layer including particles therein may be formed by performing a sputtering process that uses the alloy as a target (S52). During the sputtering process using the alloy, a large amount of magnetic material may be deposited, and a small amount of particle material may be deposited simultaneously. Since the particle material is different from the magnetic material, the particle material may be segmented in the magnetic material, such that the particle may be formed in the magnetic material. The deposited magnetic material corresponds to the free layer.

Next, a method of manufacturing the magnetic memory device shown in FIG. 2C will be described with reference to the drawings.

Figure 6A:
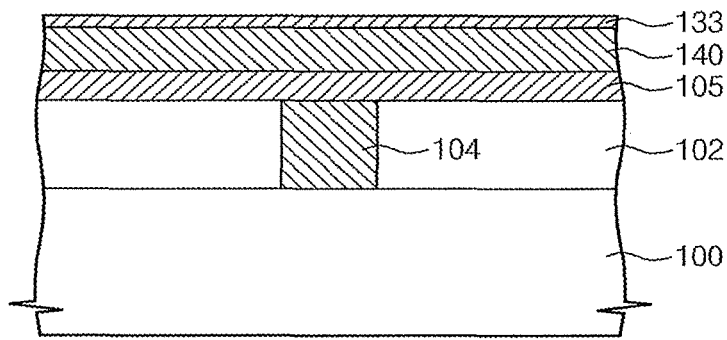
FIGS. 6A and 6B are sectional views illustrating further another modification of a method of manufacturing a magnetic memory device according to example embodiments of inventive concepts.
Figure 6B:
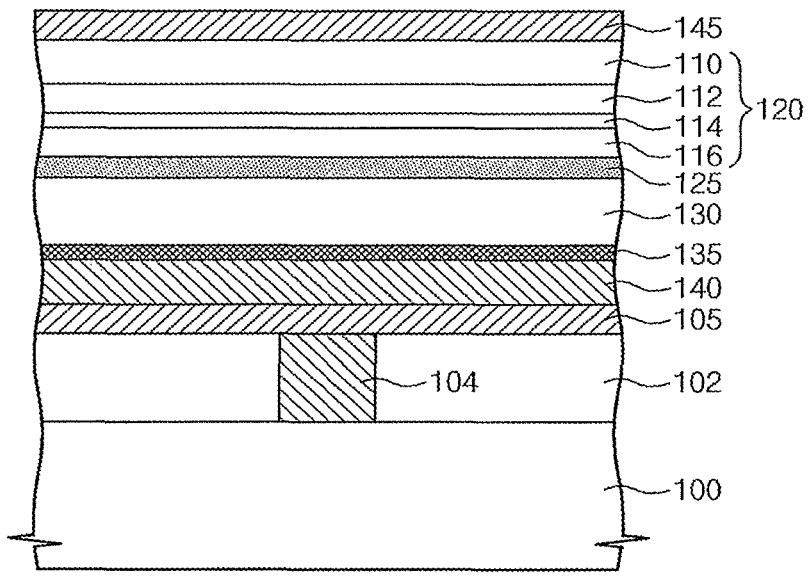

FIGS. 6A and 6B are sectional views illustrating another modification of a method of manufacturing a magnetic memory device according to example embodiments of inventive concepts.

Referring to FIG. 6A, a first electrode conductive layer 105 may be formed on a first interlayer dielectric layer 102, and a passivation layer 140 may be formed on the first electrode conductive layer 105. Next, a nonmagnetic metal layer 133 may be formed on the passivation layer 140. According to example embodiments of inventive concepts, the passivation layer 140 may be omitted. In example embodiments, the nonmagnetic metal layer 133 may be formed on the first electrode conductive layer 105.

Referring to FIG. 6B, a nonmagnetic metal oxide layer 135 may be formed by oxidizing the nonmagnetic metal layer 133. Since an oxidation method of the nonmagnetic metal oxide layer 135 is described in detail with reference to FIG. 3B, its description will be omitted here. The nonmagnetic metal oxide layer 135 may be formed through another method described with reference to FIG. 3B.

A free layer 130, a tunnel barrier layer 125, a reference layer 120, and/or a second electrode conductive layer 145 are sequentially formed on the nonmagnetic metal oxide layer 135. The reference layer 120 may include a pinning layer 110, a first pinned layer 112, an exchange coupling layer 114, and/or a second pinned layer 116. The pinning layer 110 may be formed at the uppermost position in relation to the substrate 100. The first pinned layer 112 may be formed between the pinning layer 110 and the tunnel barrier layer 125, and the second pinned layer 116 may be formed between the first pinned layer 112 and the tunnel barrier layer 125. The exchange coupling layer 114 may be formed between the first and second pinned layers 112 and 116.

Next, the layers 145, 120, 125, 130, 135, 140, and 105 are sequentially patterned, as shown in FIG. 2C, to form the sequentially stacked patterns 105a, 140a, 135a, 130a, 125a, 120a, and 145a. Next, the second interlayer dielectric layer 150, the upper contact plug 152, and the interconnection 155 of FIG. 2C may be sequentially formed. Therefore, the magnetic memory device of FIG. 2C is realized.

Next, a method of manufacturing a magnetic memory device of FIG. 2D will be described with reference to the drawings.

Figure 6C:
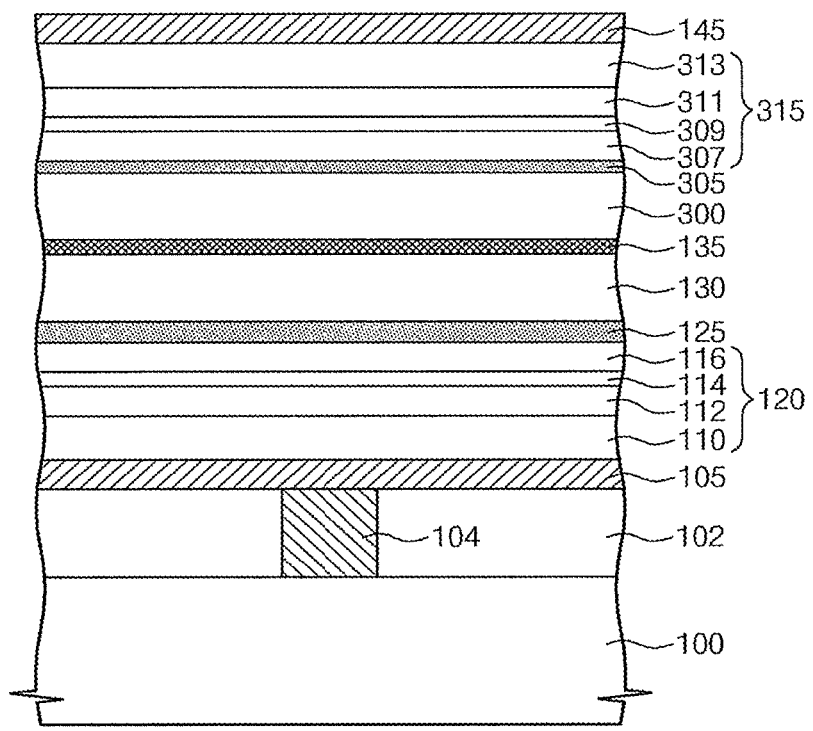
FIG. 6C is a sectional view illustrating further another modification of a method of manufacturing a magnetic memory device according to example embodiments of inventive concepts.

FIG. 6C is a sectional view illustrating further another modification of a method of manufacturing a magnetic memory device according to example embodiments of inventive concepts.

Referring to FIG. 6C, a first electrode conductive layer 105, a reference layer 120, a tunnel barrier layer 125, a free layer 130, a nonmagnetic metal oxide layer 135, a second free layer 300, a second tunnel barrier layer 305, a second reference layer 315, and a second electrode conductive layer 145 are sequentially formed on the first interlayer dielectric layer 102. The second reference layer 315 may include a pinning layer 313, an exchange coupling layer 309, and a second pinned layer 307. The pinning layer 313 may be formed at the uppermost in the second reference layer 315. The first pinned layer 311 may be formed between the pinning layer 313 and the second tunnel barrier layer 305. The second pinned layer 307 may be formed between the first pinned layer 311 and the second tunnel barrier layer 305. The exchange coupling layer 309 may be formed between the first and second pinned layers 307 and 311.

The second electrode conductive layer 145, the second reference layer 315, the second tunnel barrier layer 305, the second free layer 300, the nonmagnetic metal oxide layer 135, the first free layer 130, the first tunnel barrier layer 125, the first reference layer 120, and the first electrode conductive layer 105 are sequentially patterned such that the MTJ pattern of FIG. 2D may be formed. The subsequent processes are the same as those described with reference to FIG. 3D.

In example embodiments, like reference numerals refer to like elements. Additionally, their overlapping description will be omitted for convenience.

Figure 7:
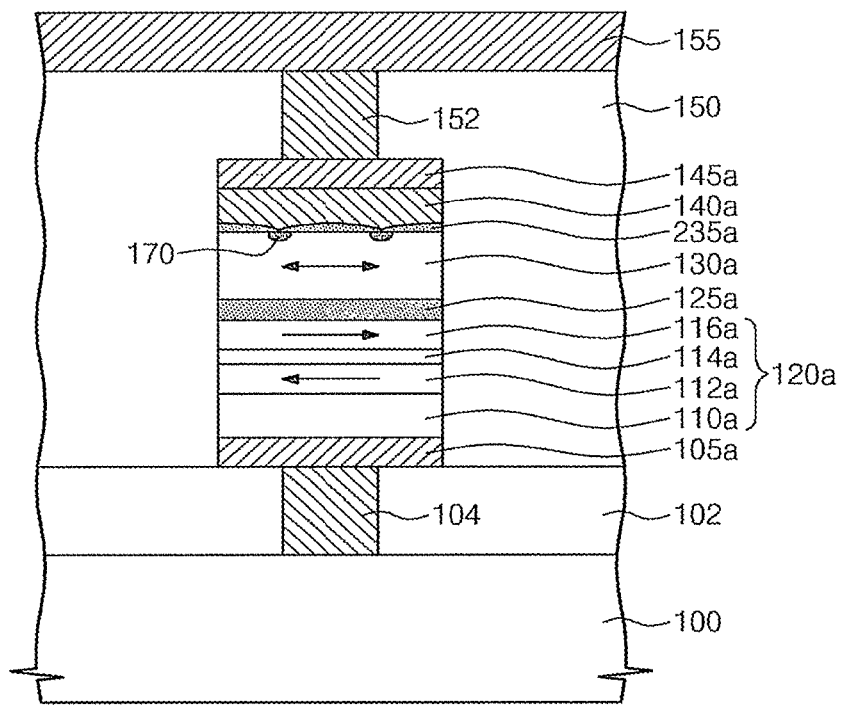
FIG. 7 is a sectional view of a magnetic memory device according to example embodiments of inventive concepts.

FIG. 7 is a sectional view of a magnetic memory device according to example embodiments of inventive concepts.

Referring to FIG. 7, the free pattern 130a may include a first surface and a second surface opposite to each other. The first surface of the free pattern 130a may be adjacent to the tunnel barrier pattern 125a. In FIG. 7, the first and second surfaces of the free pattern 130a may correspond to the bottom and top surfaces, respectively.

A surface local region 170 may be partially formed on the second surface (e.g., the top surface) of the free pattern 130a. The second surface of the free pattern 130a may include a first portion with the surface local region 170 and a second portion without the surface local region 170. The second portion of the second surface of the free pattern 130a may be formed of a magnetic material. The surface local region 170 may be formed in a portion of the second surface of the free pattern 130a and a portion of the surface portion adjacent thereto. The top surface of the surface local region 170 may be substantially coplanar with the second surface of the free pattern 130a. The surface local region 170 may be formed of a material different from the free pattern 130a. According to example embodiments of inventive concepts, the surface local region 170 may include an oxide formed by oxidizing a portion of the free pattern 130a. That is, the surface local region 170 may include an oxide including elements included in the free pattern 130a and oxygen element. Unlike this, the surface local region 170 may include a nitride formed by nitrifying a portion of the free pattern 130a. That is, the surface local region 170 may include a nitride including elements in the free pattern 130a and nitrogen element. Since the surface local region 170 is formed of a different material than the free pattern 130a, atomic-magnetic moments non-parallel to the second surface of the free pattern 130a may be generated in a portion of the free pattern 130a adjacent to the surface local region 170. Accordingly, the critical current density (e.g., a minimum current density for reversing a magnetization direction of the free pattern 130a) may be reduced. As a result, a magnetic memory device improved or optimized for lower power consumption and/or higher degree of integration may be realized.

A thin pattern 235a may be disposed on the second surface of the free pattern 130a. The thin pattern 235a may contact the second surface of the free pattern 130a. According to example embodiments of inventive concepts, the thin pattern 235a may include a first portion having a first thickness and a second portion having a second thickness thinner than the first thickness. The surface local region 170 may be disposed directly below the second portion of the thin pattern 235a having a relatively thinner thickness (e.g., the second thickness). The surface local region 170 may contact the thin pattern 235a. The thin pattern 235a may have a thin thickness to reduce or minimize the increase of a magnetic resistance ratio and/or the increase of an MTJ pattern resistance. For example, as mentioned above, the thin pattern 235a may have a thickness of about 2 Å to about 20 Å. When the thin pattern 235a may have an irregular thickness, a thickness of the first portion (a relatively thick portion) of the thin pattern 235a may be greater than about 2 Å and equal to or less than about 20 Å, and the second portion (a relatively thin portion) of the thin pattern 235a may be equal to or more than about 2 Å and less than about 20 Å. The thin pattern 235*a* may include an oxide or a nitride. The thin pattern 235*a* may include a nonmagnetic metal oxide or a nonmagnetic metal nitride. For example, the thin pattern 235*a* may include at least one of tantalum oxide, zinc oxide, hafnium oxide, zirconium oxide, magnesium oxide, titanium oxide, chrome oxide, copper oxide, chrome nitride, tantalum nitride, hafnium nitride, titanium nitride, or copper nitride. A passivation pattern 140*a* and a second electrode 145*a* may be sequentially formed on the thin pattern 235*a*.

Next, other example embodiments of inventive concepts will be described with reference to the drawings.

Figure 8A:
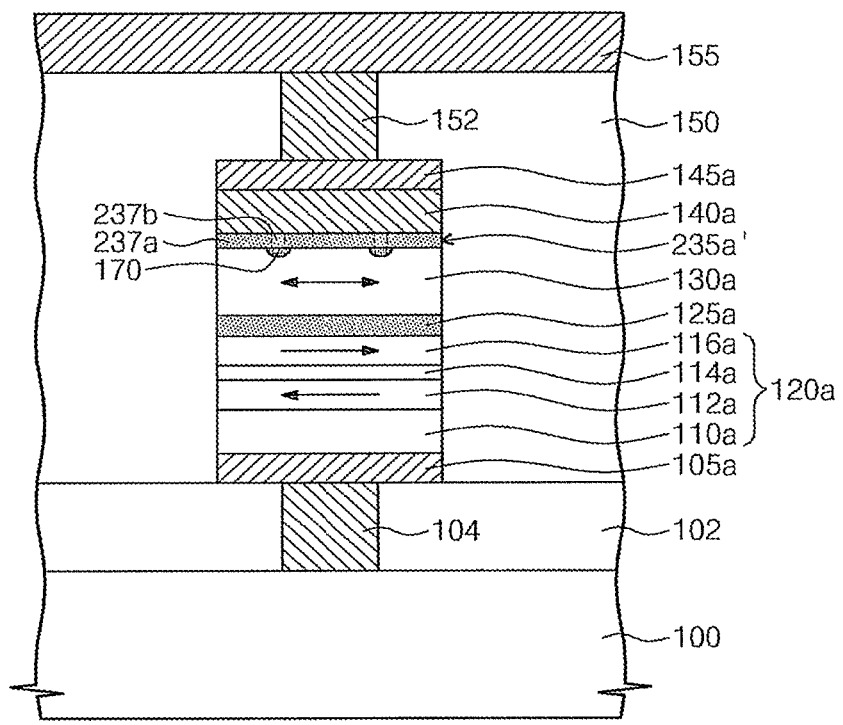
FIG. 8A is a sectional view illustrating a modification of a magnetic memory device according to example embodiments of inventive concepts.

FIG. 8A is a sectional view illustrating a modification of a magnetic memory device according to example embodiments of inventive concepts.

Referring to FIG. 8A, a thin pattern 235*a*' may contact the second surface of the free pattern 130*a*. The thin pattern 235*a*' may include a first portion 237*a* of an amorphous state and a second portion 237*b* of a crystalline state. The surface local region 170 may be disposed directly below the second portion 237*b* and may contact the second portion 237*b*. The thin pattern 235*a*' may substantially have a uniform thickness. For example, the thin pattern 235*a*' may have a thickness of about 2 Å to about 20 Å. The thin pattern 235*a*' may be formed of the same material as the thin pattern 235*a* described with reference to FIG. 7.

Figure 8B:
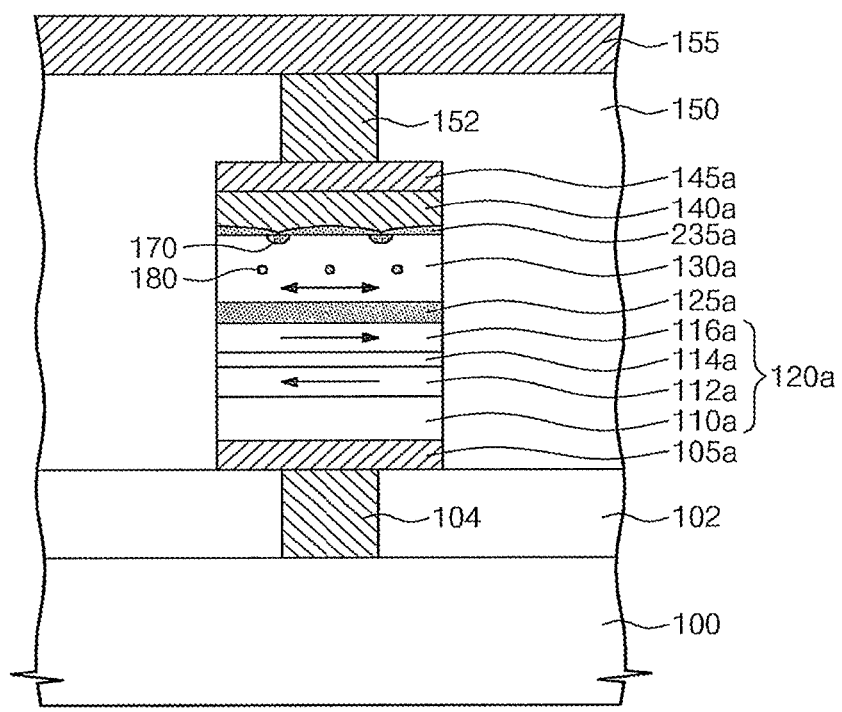
FIG. 8B is a sectional view illustrating another modification of a magnetic memory device according to example embodiments of inventive concepts.

FIG. 8B is a sectional view illustrating another modification of a magnetic memory device according to example embodiments of inventive concepts.

Referring to FIG. 8B, at least one particle 180 may be disposed within the free pattern 130*a*. The particle 180 may be formed of the same material described with reference to FIG. 2B. The critical current density may be reduced more by the non-parallel atomic-magnetic moments generated by the surface local region 170 and the particle 180. In FIG. 8B, the thin pattern 235*a* may be replaced with the thin pattern 235*a*' of FIG. 8A.

Figure 8C:
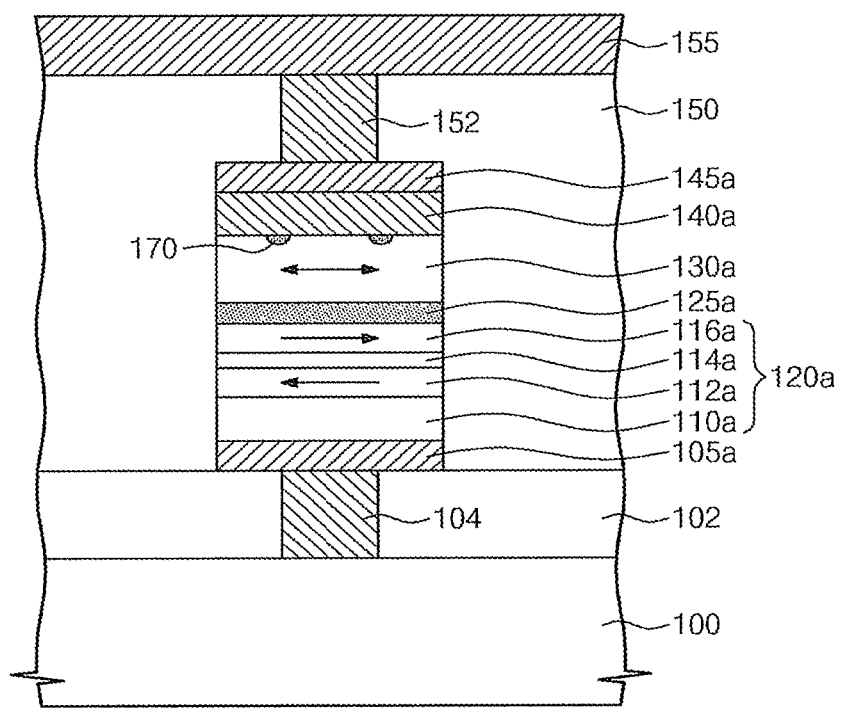
FIG. 8C is a sectional view illustrating further another modification of a magnetic memory device according to example embodiments of inventive concepts.

FIG. 8C is a sectional view illustrating further another modification of a magnetic memory device according to example embodiments of inventive concepts.

Referring to FIG. 8C, according to this modification, a thin pattern may be omitted. In example embodiments, the surface local region 170 may contact the passivation pattern 140*a*. According to example embodiments of inventive concepts, the passivation pattern 140*a* may be omitted and the surface local region 170 may contact the second electrode 145*a*.

Figure 8D:
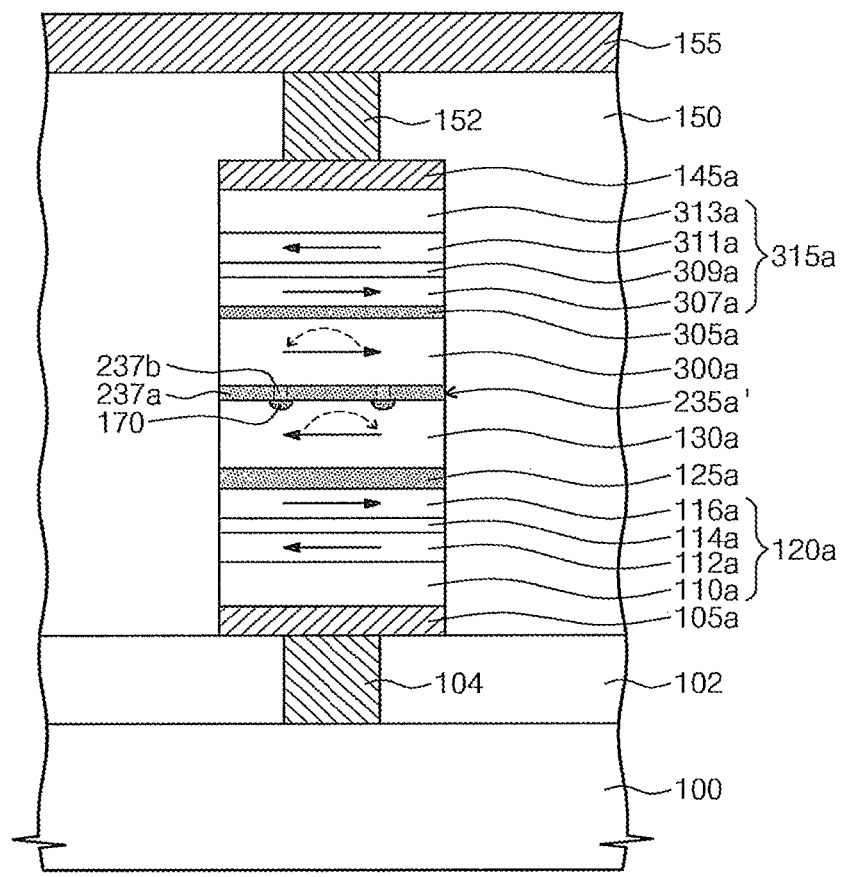
FIG. 8D is a sectional view illustrating further another modification of a magnetic memory device according to example embodiments of inventive concepts.

FIG. 8D is a sectional view illustrating another modification of a magnetic memory device according to example embodiments of inventive concepts.

Referring to FIG. 8D, according to this modification, an MTJ pattern may include a first reference pattern 120*a*, a first tunnel barrier pattern 125*a*, a first free pattern 130*a*, a thin pattern 235*a*', a second free pattern 300*a*, a second tunnel barrier pattern 305*a*, and a second reference pattern 315*a*, which are sequentially stacked on a first interlayer dielectric layer 102. A first electrode 105*a* may be disposed between the first reference pattern 120*a* and the first interlayer dielectric layer 102, and a second electrode 145*a* may be disposed on the second reference pattern 315*a*. The first free pattern 130*a* may include a surface local region 170 formed on a portion of the top surface of the first free pattern 130*a*. As described with reference to FIG. 2D, during one program operation, minor electrons reflected by the second pinned pattern 307*a* of the second reference pattern 315*a* may contribute to reversing the magnetization direction of the second free pattern 300*a*.

As a result, according to this modification, a critical current density may be reduced by the surface local region 170. Additionally, during one program operation, by the MTJ pattern including at least the free patterns 130*a* and 300*a* and the reference patterns 120*a* and 315*a*, major electrons and minor electrons are used to reverse the magnetization directions of the first and second free patterns 130*a* and 300*a*. Thereby, a critical current density may be further reduced.

According to example embodiments of inventive concepts, the particle 180 of FIG. 8B may be disposed within the first free pattern 130*a* of FIG. 8D. According to example embodiments of inventive concepts, the particle 180 of FIG. 8B may be disposed in the second free pattern 300*a*. According to example embodiments of inventive concepts, the thin pattern 235*a*' may be replaced with the thin pattern 235*a* of FIG. 7.

Next, methods of manufacturing a magnetic memory device according to example embodiments of inventive concepts will be described with reference to the drawings.

Figure 9A:
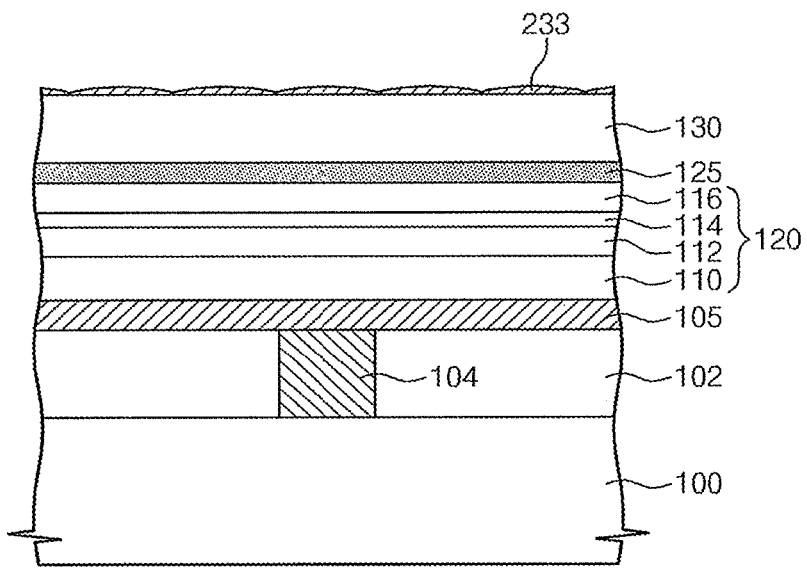
FIGS. 9A and 9B are sectional views illustrating manufacturing methods of a magnetic memory device according to example embodiments of inventive concepts.
Figure 9B:
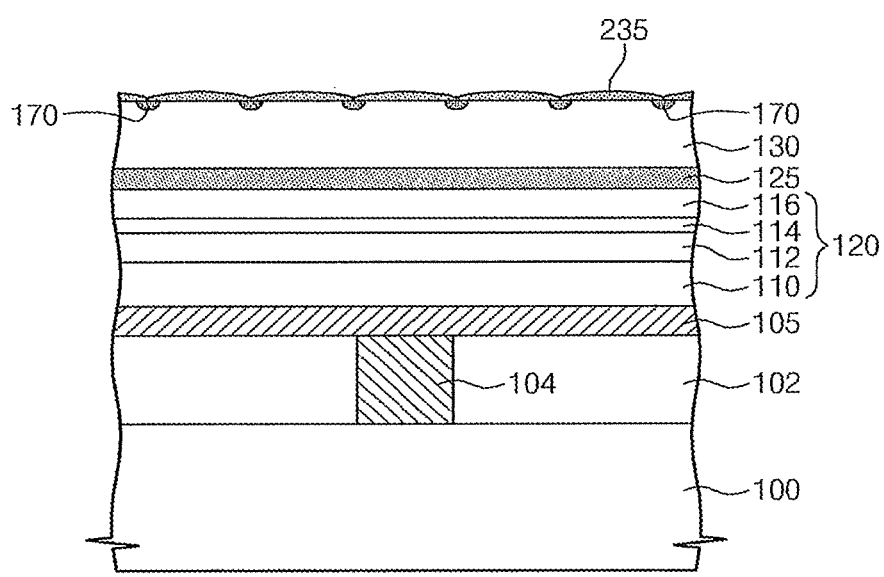

FIGS. 9A and 9B are sectional views illustrating manufacturing methods of a magnetic memory device according to example embodiments of inventive concepts.

Referring to FIG. 9A, a first electrode conductive layer 105, a reference layer 120, a tunnel barrier layer 125, and a free layer 130 may be sequentially formed on a first interlayer dielectric layer 102. A material layer 233 having an uneven thickness may be formed on the free layer 130. The material layer 233 may include a first portion and a second portion having a thinner thickness than the first portion. According to example embodiments of inventive concepts, the material layer 233 may include a material for lowering wettability. The wettability refers to a degree that material layer 233 spreads on the free layer 130. In example embodiments, the sum of the surface energy of the free layer 130 and the surface energy of the material layer 233 may be less than an interfacial energy between the free layer 130 and the material layer 233. Thereby, the wettability becomes lower such that the material layer 233 may be formed with an uneven thickness. Alternatively, by changing the surface energy of the free layer 130 regardless of kinds of materials of the material layer 233, the wettability of the material layer 233 may be lowered. This will be described with reference to the drawings.

Figure 9C:
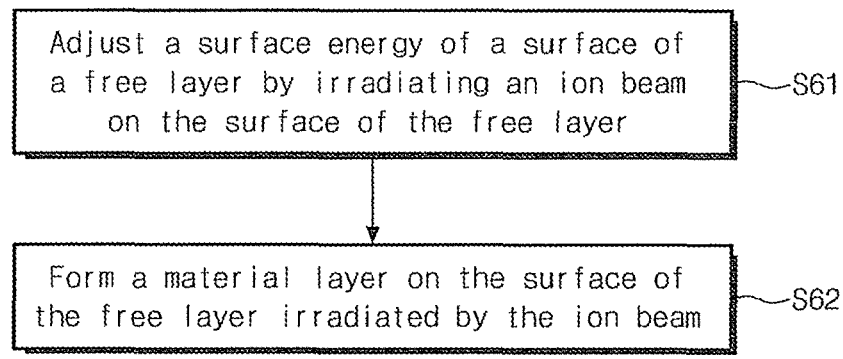
FIG. 9C is a flowchart illustrating another method of manufacturing the material layer of FIG. 9A according to example embodiments of inventive concepts.

FIG. 9C is a flowchart illustrating a method of forming the material layer of FIG. 9A.

Referring to FIGS. 9A and 9C, before the forming of the material layer 233, the surface energy of the free layer 130 may be adjusted by irradiating an ion beam on the exposed surface of the free layer 130 (S61). According to example embodiments of inventive concepts, the ion beam may be irradiated to decrease the surface energy of the free layer 130. Accordingly, the sum of the surface energy of the free layer 130 and the surface energy of the material layer 233 may be decreased. The material layer 233 may be formed on the surface of a free layer 130 on which an ion beam is irradiated (S62). The material layer 233 may be formed through a sputtering process. The wettability for the free layer 130 of the material layer 233 may be lowered by adjusting the surface energy of the exposed surface of the free layer using the ion beam, such that the material layer 233 may be formed with an uneven thickness. The material layer 233 may include a nonmagnetic metal. For example, the material layer 233 may include at least one of tantalum, zinc, hafnium, zirconium, magnesium, titanium, chrome, or copper.

Referring to FIG. 9B, according to example embodiments of inventive concepts, a thin layer 235 and a surface local region 170 may be formed by oxidizing the material layer 233 having an uneven thickness. Oxygen supplied for oxidation of the material layer 233 may be supplied to a portion of the second surface of the free layer 130 through a relatively thin portion of the material layer 233. Accordingly, the thin layer 235 and the surface local region 170 may be formed simultaneously. In example embodiments, the thin layer 235 may include an oxide formed by oxidizing the material layer 233, and the surface local region 170 may include an oxide formed by oxidizing a portion of the free layer 130. The material layer 233 may be oxidized through a natural oxidation, a radical oxidation process or a plasma oxidation process.

Unlike this, the thin layer 235 and the surface local region 170 may be formed by nitrifying the material layer 233 having the uneven thickness. In example embodiments, the surface local region 170 may include a nitride formed by nitrifying a portion of the free layer 130, and the thin layer 235 may include a nitride formed by nitrifying the material layer 233. The material layer 233 may be nitrified through a radical nitrification process or a plasma nitrification process.

Next, the passivation layer 140 and the second electrode conductive layer 145 of FIG. 3C may be sequentially formed on the thin layer 235. Next, the second electrode conductive layer 145, the passivation layer 140, the thin layer 235, the free layer 130, the tunnel barrier layer 125, the reference layer 120, and the first electrode conductive layer 105 are sequentially patterned to form the patterns 105a, 120a, 125a, 130a, 140a, and 145a of FIG. 7. Next, by sequentially forming the second interlayer dielectric layer 150, the upper contact plug 152, and the interconnection 155, the magnetic memory device of FIG. 7 may be realized.

Alternatively, the material layer 233 may be formed to have a first portion of an amorphous state and a second portion of a crystalline state. In example embodiments, oxygen for oxidation or nitrogen for nitrification may be provided to the free layer 130 through the second portion of the crystalline state in the material layer 233. In example embodiments, the material layer 233 may be formed with a uniform thickness. Therefore, the thin layer 235 of FIG. 9B may be formed with a uniform thickness. Next, a passivation layer and a second electrode conductive layer may be sequentially formed, and stacked layers may be consecutively patterned. Therefore, the magnetic memory device of FIG. 8A may be realized.

According to example embodiments of inventive concepts, the particles 180 may be formed in the free layer 130 of FIG. 9A using one of the methods of FIGS. 5A through 5C. The following processes may be equal to those of FIG. 9B. Thereby, the magnetic memory device of FIG. 8B may be realized.

According to example embodiments of inventive concepts, after the forming of the surface local region 170, the surface local region 170 and the free layer 130 may be exposed by removing the thin layer 235 of FIG. 9B. Next, a passivation layer and a second electrode conductive layer are sequentially formed and a patterning process may be performed. Therefore, the magnetic memory device of FIG. 8C may be realized.

According to example embodiments of inventive concepts, a second free layer, a second tunnel barrier layer, a second reference layer, and a second electrode conductive layer are sequentially formed on a thin layer, and the stacked layers are consecutively patterned to form the MTJ pattern of FIG. 8D. Later, a second interlayer dielectric layer, an upper contact plug, and interconnections may be sequentially formed. Therefore, the magnetic memory device of FIG. 8D may be realized.

Throughout embodiments, like reference numerals refer to like elements and their overlapping description will be omitted.

Figure 10A:
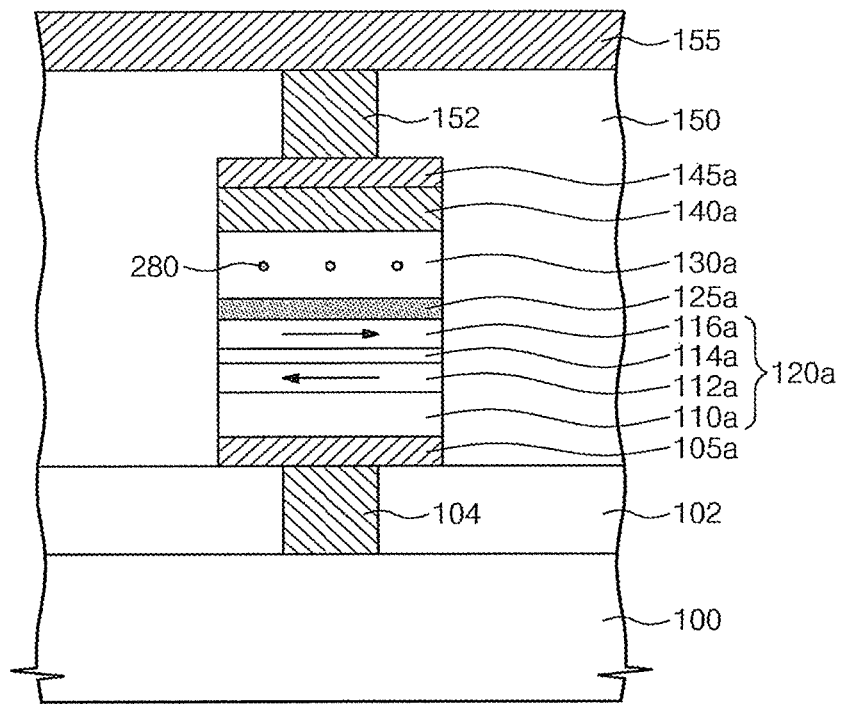
FIG. 10A is a sectional view illustrating a magnetic memory device according to example embodiments of inventive concepts.

FIG. 10A is a sectional view illustrating a magnetic memory device according to example embodiments of inventive concepts.

Referring to FIG. 10A, a first electrode 105a, a reference pattern 120a, a tunnel barrier pattern 125a, a free pattern 130a, a passivation pattern 140a, a second electrode 145a may be sequentially stacked on a first interlayer dielectric layer 102. At least one particle 280 may be disposed within the free pattern 130a. The particle 280 may include a non-magnetic conductive material. The particle 280 may be spaced from the bottom and top surfaces of the free pattern 130a. For example, the particles 280 may include at least one of tantalum, zinc, hafnium, zirconium, magnesium, titanium, chrome, copper, a tantalum nitride, a zinc nitride, a hafnium nitride, a zirconium nitride, a magnesium nitride, a titanium nitride, a chrome nitride, or a copper nitride. According to example embodiments of inventive concepts, the free pattern 130a may contact the passivation pattern 140a.

The particle 280 may include a different material from the free pattern 130a, such that atomic-magnetic moments non-parallel to the top and bottom surfaces of the free pattern 130a may be generated in a portion of the free pattern 130a around the particle 280. Thereby, a critical current density for reversing the magnetization direction of the free pattern 130a may be reduced. As a result, a magnetic memory device improved or optimized for lower power consumption and/or higher degree of integration may be realized. The particle 280 includes a nonmagnetic conductive material, such that resistance increase of the free pattern 130a may be reduced or minimized. Accordingly, a magnetic resistance ratio of the MTJ pattern may be minimally reduced, such that a magnetic memory device with excellent reliability may be realized.

Figure 10B:
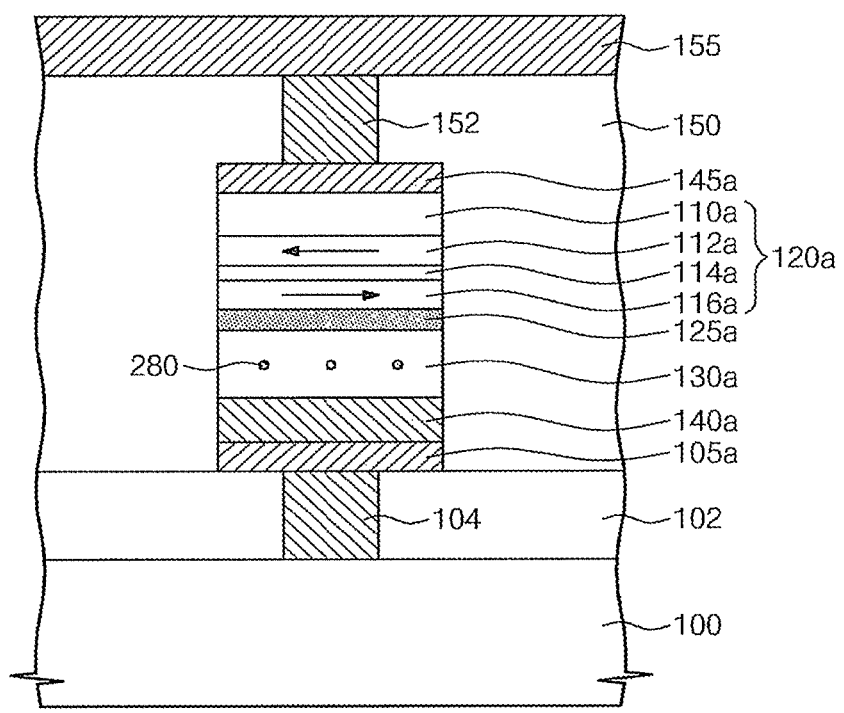
FIG. 10B is a sectional view illustrating a modification of a magnetic memory device according to example embodiments of inventive concepts.

FIG. 10B is a sectional view illustrating a modification of a magnetic memory device according to example embodiments of inventive concepts.

Referring to FIG. 10B, according to this modification, a first electrode 105a, a passivation pattern 140a, a free pattern 130a including a particle 280, a tunnel barrier pattern 125a, a reference pattern 120a, and a second electrode 145a may be sequentially stacked on a first interlayer dielectric layer 102. According to this modification, the free pattern 130a is disposed below the tunnel barrier pattern 125a and the reference pattern 120a may be disposed on the tunnel barrier pattern 125a. The passivation pattern 140a may be omitted.

Figure 10C:
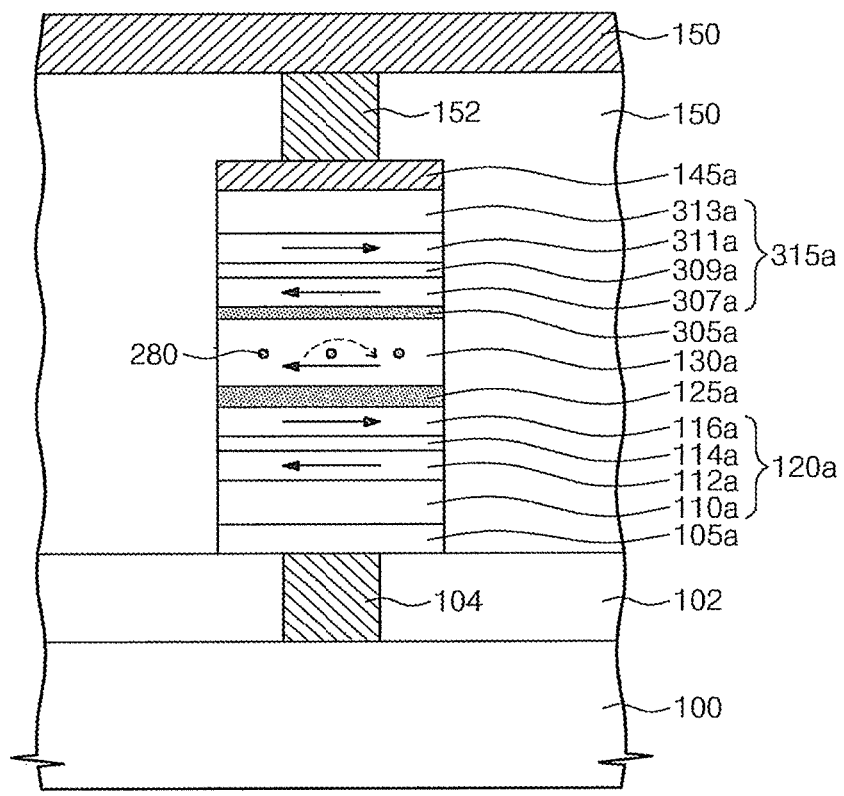
FIG. 10C is a sectional view illustrating another modification of a magnetic memory device according to example embodiments of inventive concepts.

FIG. 10C is a sectional view illustrating another modification of a magnetic memory device according to example embodiments of inventive concepts. The above-mentioned reference pattern 120a and tunnel barrier pattern 125a may correspond to a first reference pattern 120a and a first tunnel barrier pattern 125a, respectively.

Referring to FIG. 10C, according to this modification, an MTJ pattern may include the first reference pattern 120a, the first tunnel barrier pattern 125a, the free pattern 130a, a second tunnel barrier pattern 305a, and a second reference pattern 315a, which are sequentially stacked on a first interlayer dielectric layer 102. Moreover, the MTJ pattern may further include a particle 280 within the free pattern 130a. A first electrode 105a may be disposed between the first reference pattern 120a and the first interlayer dielectric layer 102, and the second electrode 145a may be disposed on the second reference pattern 315a.

According to this modification, the first and second tunnel barrier patterns 125a and 305a may contact the bottom and top surfaces of the free pattern 130a, respectively. In the modification, as shown in the drawings, the fixed magnetization direction of the second pinned pattern 116a of the first reference pattern 120a may be anti-parallel to that of the second pinned pattern 307a of the second reference pattern 315a. An anti-ferromagnetic material in the pinning pattern 110a of the first reference pattern 120a may have a first blocking temperature, and an anti-ferromagnetic material in the pinning pattern 313a of the second reference pattern 315a may have a second blocking temperature. The first blocking temperature may be different from the second blocking temperature. Therefore, after heat with a temperature between the first and second blocking temperatures is applied to the MTJ pattern, an external magnetic field is provided to arrange the magnetization directions of the second pinned patterns 116a and 313a of the first and second reference patterns 120a and 315a to be anti-parallel to each other. For example, one of the pinning patterns 116a and 313a of the first and second reference patterns 120a and 315a may include IrMn and the other may include PtMn.

When electrons in a program current flow from the first electrode 105a to the second electrode 145a, first electrons penetrating the second pinned pattern 116a of the first reference pattern 120a may be accumulated in the free pattern 130a. In addition, second electrons reflected by the second pinned pattern 307a of the second reference pattern 315a may be accumulated in the free pattern 130a. The electrons may have spins parallel to the magnetization direction of the second pinned pattern 116a, and the second electrons may have spins anti-parallel to the magnetization direction of the second pinned pattern 307a. That is, the spins of the first electrons are parallel to that of the second electrons. Therefore, a magnetization direction of the free pattern 130a can be reversed. As a result, a critical current density is reduced by the particle 280 along with the reference patterns 120a and 315a and the free pattern 130a. Therefore, a magnetic memory device having lower power consumption and/or higher degree of integration may be realized.

Figure 11A:
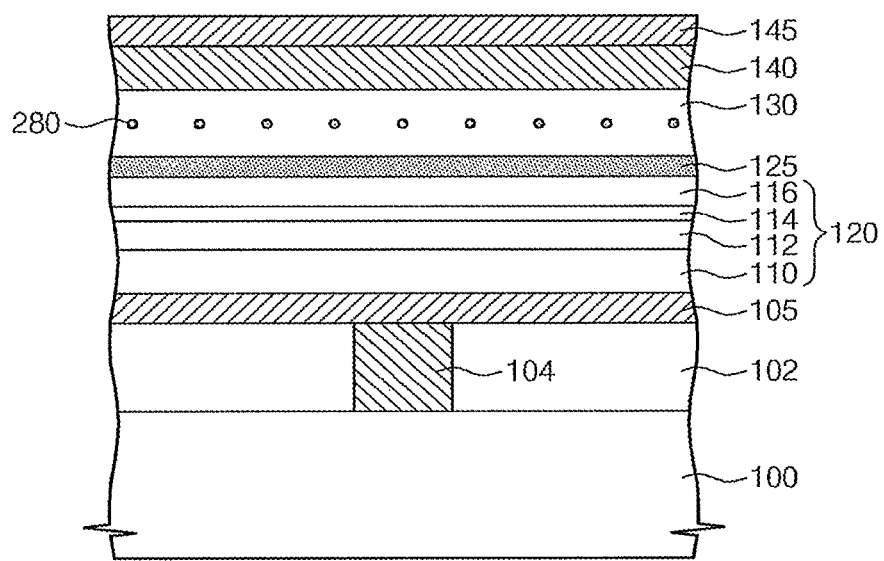
FIG. 11A is a sectional view illustrating a method of manufacturing a magnetic memory device according to example embodiments of inventive concepts.
Figure 11B:
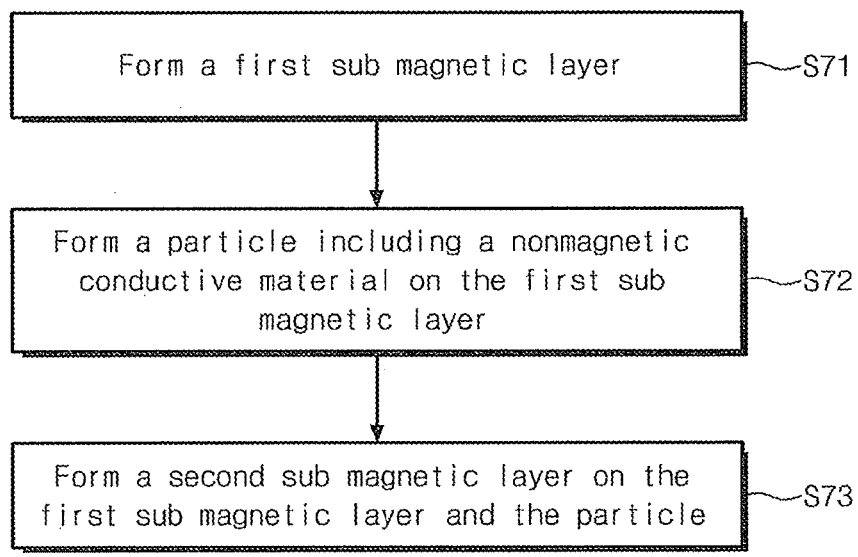
FIG. 11B is a flowchart illustrating a method of forming the free layer of FIG. 11A according to example embodiments of inventive concepts.
Figure 11C:
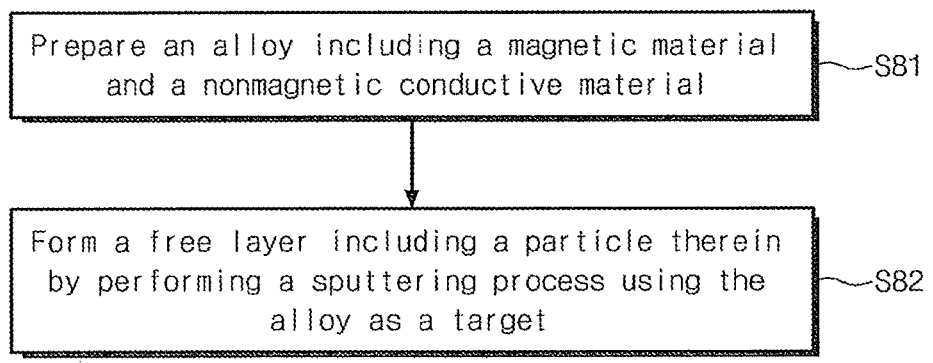
FIG. 11C is a flowchart illustrating another method of forming the free layer of FIG. 11A according to example embodiments of inventive concepts.

FIG. 11A is a sectional view illustrating a method of manufacturing a magnetic memory device according to example embodiments of inventive concepts. FIG. 11B is a flowchart illustrating a method of forming the free layer of FIG. 11A. FIG. 11C is a flowchart illustrating another method of forming the free layer of FIG. 11A.

Referring to FIG. 11A, a first electrode conductive layer 105, a reference layer 120, and a tunnel barrier layer 125 are sequentially formed on a first interlayer dielectric layer 102, and a free layer 130 including a particle 280 may be formed on the tunnel barrier layer 125. A method of forming the free layer 130 including the particle 280 will be described with reference to FIG. 11B.

Referring to FIGS. 11A and 11B, a first sub magnetic layer is formed on the tunnel barrier layer 125 (S71). A particle 280 including a nonmagnetic conductive material is formed on the first sub magnetic layer (S72), and a second sub magnetic layer is formed on the first sub magnetic layer and the particle 280 (S73). The first and second sub magnetic layers may be included in the free layer 130. The first and second sub magnetic layers may be formed of the same magnetic material. Therefore, the free layer 130 including the particle 280 may be formed.

Another method of forming the free layer 130 including the particle 280 will be described with reference to FIG. 11C.

Referring to FIGS. 11A and 11C, an alloy including a magnetic material and a nonmagnetic conductive material may be prepared (S81). A content ratio of the magnetic material in the alloy may be far greater than that of the nonmagnetic conductive material in the alloy. By performing a sputtering process using the alloy as a target, a free layer 130 including the particle 280 may be formed (S82). During the sputtering process, the nonmagnetic conductive material of a relatively small amount may be segmented in the magnetic material, such that the particle 280 may be formed.

According to example embodiments of inventive concepts, a first electrode conductive layer 105, a passivation layer 140, a free layer 130 including a particle 280, a tunnel barrier layer 125, a reference layer 120, and a second electrode conductive layer 145 may be sequentially formed on a first interlayer dielectric layer 102. Then, by performing subsequent processes including a process for patterning the stacked layers, the magnetic memory device of FIG. 10B may be realized.

According to example embodiments of inventive concepts, as shown in FIG. 11A, a process for forming a passivation layer is omitted, and before the forming of the second electrode layer, the second tunnel barrier layer 305 of FIG. 6C and the second reference layer 315 of FIG. 6C may be sequentially formed on the top surface of the free layer 130. Later, by performing subsequent processes including a process for consecutively patterning the stacked layers, the magnetic memory device of FIG. 10C may be realized.

Throughout example embodiments, like reference numerals refer to like elements and their overlapping description will be omitted.

Figure 12:
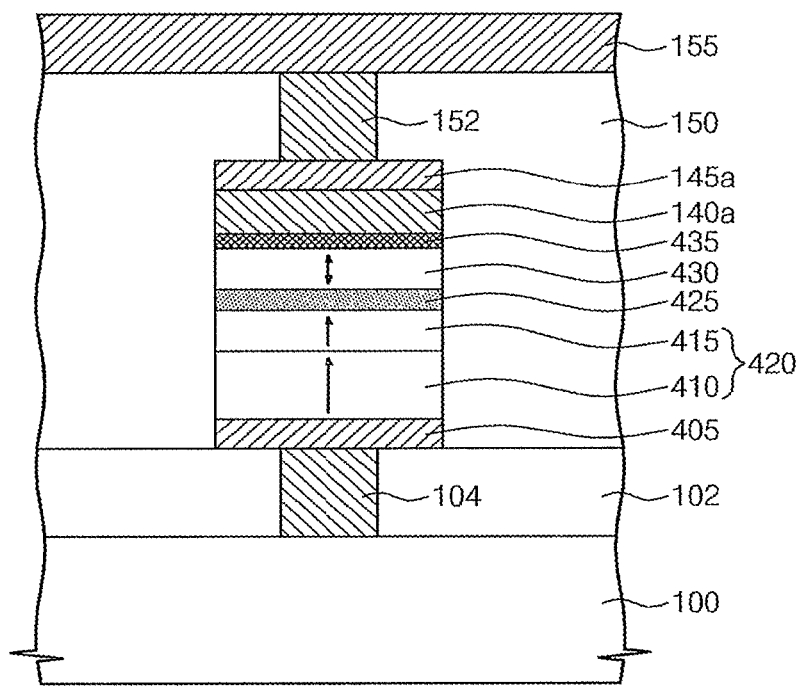
FIG. 12 is a sectional view illustrating a magnetic memory device according to example embodiments of inventive concepts.

FIG. 12 is a sectional view illustrating a magnetic memory device according to example embodiments of inventive concepts.

Referring to FIG. 12, a first electrode 405, a reference pattern 420, a tunnel barrier pattern 425, a free pattern 430, a perpendicular anisotropy enhanced pattern 435, a passivation pattern 140a, and a second electrode 145a may be sequentially stacked on a first interlayer dielectric layer 102. The free pattern 430 has a first surface adjacent to the tunnel barrier pattern 425 and a second surface contacting the perpendicular anisotropy enhanced pattern 435. The first and second surfaces of the free pattern 430 may correspond to the bottom and top surfaces of the free pattern 430, respectively. The first and second surfaces of the free pattern 430 may be opposite to each other and may be parallel to each other. In addition, the first and second surfaces of the free pattern 430 may be parallel to the top surface of the substrate 100.

The reference pattern 420 may include a reference perpendicular magnetic pattern 410 and a spin polarization pattern 415 disposed between the reference perpendicular magnetic pattern 410 and the tunnel barrier pattern 425. According to example embodiments of inventive concepts, the spin polarization pattern 415 may contact the reference perpendicular magnetic pattern 410 and the tunnel barrier pattern 425. The reference perpendicular magnetic pattern 410 may have a first fixed magnetization direction substantially perpendicular to the first and second surfaces of the free pattern 430. The spin polarization pattern 415 may have a second fixed magnetization direction substantially perpendicular to the first and second surfaces of the free pattern 430.

The reference perpendicular magnetic pattern 410 may have a material and/or a structure having the first fixed magnetization direction by itself. For example, the reference perpendicular magnetic pattern 410 may include at least one of a perpendicular magnetic material (e.g., CoFeTb, CoFeGd, or CoFeDy and so on), a perpendicular magnetic material of an L10 structure, CoPt of a hexagonal close packed lattice structure, or an alloy thereof. The perpendicular magnetic material of an L10 structure may include at least one of FePt of an $L1_0$ structure, FePd of an $L1_0$ structure, CoPd of an $L1_0$ structure, or CoPt of an $L1_0$ structure. When the reference perpendicular magnetic pattern 410 includes CoFeTb, a Tb content ratio in CoFeTb may be equal to or more than about 10%. Similarly, when the reference perpendicular magnetic pattern 410 includes CoFeGd, a Gd content ratio in CoFeGb may be equal to or more than about 10%. According to example embodiments of inventive concepts, the reference perpendicular magnetic pattern 410 may include a perpendicular magnetic structure having magnetic layers and nonmagnetic layers, which are alternately and repeatedly stacked. For example, the perpendicular magnetic structure may include at least one of (Co/Pt)n, (CoFe/Pt)n, (CoFe/Pd)n, (CoP)n, (Co/Ni)n, (CoNi/Pt)n, (CoCr/Pt)n, or (CoCr/Pd)n (n is the number of stacked layers).

The first electrode 405 may perform a function of a seed layer about the reference perpendicular magnetic pattern 410. Furthermore, the first electrode 405 may include a conductive material having an excellent barrier property. For example, when the reference perpendicular magnetic pattern 410 includes a perpendicular magnetic material of an $L1_0$ structure, the first electrode 405 may include a conductive metal nitride having a sodium chloride structure (e.g., a titanium nitride, a tantalum nitride, a chrome nitride, or a vanadium nitride). However, inventive concepts are not limited thereto. The first electrode 405 may include another conductive material.

The spin polarization pattern 415 may include a magnetic material. The second fixed magnetization direction of the spin polarization pattern 415 may be fixed substantially perpendicular to the first and second surfaces of the free pattern 430 by the reference perpendicular magnetic pattern 410. According to example embodiments of inventive concepts, when the spin polarization pattern 415 contacts the reference perpendicular magnetic pattern 410, the second fixed magnetization direction of the spin polarization pattern 415 may be parallel to the first fixed magnetization direction of the reference perpendicular magnetic pattern 410. For example, the spin polarization pattern 415 may include at least one of CoFeB, CoFe, NiFe, CoFePt, CoFePd, CoFeCr, CoFeTb, CoFeGd, or CoFeNi. When the spin polarization pattern 415 includes iron (Fe) and cobalt (Co), a content ratio of iron (Fe) in the spin polarization pattern 415 may be greater than a content ratio of cobalt (Co) in the spin polarization pattern 415. Therefore, the second fixed magnetization direction of the spin polarization pattern 415 may become easily perpendicular to the first and second surfaces of the free pattern 430.

The tunnel barrier pattern 425 may have a thickness that is less than a spin diffusion length. The tunnel barrier pattern 425 may include an insulating material. For example, the tunnel barrier pattern 425 may include at least one of a magnesium oxide, a titanium oxide, an aluminum oxide, a magnesium-zinc oxide, or a magnesium-boron oxide.

The free pattern 430 may include a magnetic material. For example, the free pattern 430 may include at least one of CoFeB, CoFe, NiFe, CoFePt, CoFePd, CoFeCr, CoFeTb, CoFeGd, or CoFeNi. When the free pattern 430 includes CoFeTb, a Tb content ratio in CoFeTb of the free pattern 430 may be equal to or more than about 10%. Similarly, when the free pattern 430 includes CoFeGd, a Gd content ratio in CoFeGb of the free pattern 430 may be equal to or more than about 10%.

The perpendicular anisotropy enhanced pattern 435 may contact the second surface (e.g., the top surface) of the free pattern 430, such that atomic-magnetic moments perpendicular to the second surface of the free pattern 430 are generated in the free pattern 430. Accordingly, the magnetization direction of the free pattern 430 may be substantially perpendicular to the second surface of the free pattern 430. In example embodiments, a net magnetization direction by the vector sum of the atomic-magnetic moments in the free pattern 430 may be substantially perpendicular to the second surface of the free pattern 430. The perpendicular anisotropy enhanced pattern 435 may apply stress (compressive force or tensile force) to the free pattern 430. Accordingly, the atomic-magnetic moments perpendicular to the second surface may be generated in the free pattern 430, such that the free pattern 430 may have a magnetization direction that is substantially perpendicular to the second surface of the free pattern 430. According to example embodiments of inventive concepts, if the perpendicular anisotropy enhanced pattern 435 does not contact the free pattern 430, the free pattern 430 may have the atomic-magnetic moments non-perpendicular to the second surface of the free pattern 430. The non-perpendicular atomic-magnetic moments may be converted to be perpendicular to the second surface by the perpendicular anisotropy enhanced pattern 435.

The perpendicular magnetization direction of the free pattern 430 may be changeable to parallel or anti-parallel to the fixed magnetization direction of the reference pattern 420 (e.g., the second fixed magnetization direction of the spin polarization pattern 415). The perpendicular magnetization direction of the free pattern 430 may be changed by spins of electrons in a program current.

According to example embodiments of inventive concepts, the free pattern 430 may include iron (Fe) and (Co). A content ratio of iron (Fe) in the free pattern 430 may be greater than a content ratio of cobalt (Co) in the free pattern 430, such that a perpendicular anisotropy characteristic of the free pattern 430 may be further improved. According to example embodiments of inventive concepts, the free pattern 430 may have a thin thickness to have the perpendicular magnetization direction. For example, the free pattern 430 may have a thickness of about 10 Å to about 20 Å. However, inventive concepts are not limited thereto. The free pattern 430 may have various thicknesses.

The perpendicular anisotropy enhanced pattern 435 may have a nonmagnetic metal compound. For example, the perpendicular anisotropy enhanced pattern 435 may include a nonmagnetic metal oxide. A content ratio of a nonmagnetic metal in the nonmagnetic metal oxide of the perpendicular anisotropy enhanced pattern 435 may be greater than a stoichiometric ratio. That is, the perpendicular anisotropy enhanced pattern 435 may include a nonmagnetic metal-rich metal oxide. Accordingly, a resistivity of the perpendicular anisotropy enhanced pattern 435 can be reduced such that magnetic resistivity reduction by the perpendicular anisotropy enhanced pattern 435 may be reduced or minimized. According to example embodiments of inventive concepts, a concentration of the nonmagnetic metal in the perpendicular anisotropy enhanced pattern 435 may be substantially uniform over the entire perpendicular anisotropy enhanced pattern 435. Accordingly, a resistivity of the perpendicular anisotropy enhanced pattern 435 may be substantially uniformly reduced. For example, the perpendicular anisotropy enhanced pattern 435 may include at least one of a hafnium-rich hafnium oxide, a tantalum-rich tantalum oxide, a zirconium-rich oxide, a chromium-rich chromium oxide, a vanadium-rich vanadium oxide, a molybdenum-rich molybdenum oxide, a titanium-rich titanium oxide, a tungsten-rich tungsten oxide, an yttrium-rich yttrium oxide, a magnesium-rich magnesium oxide, or a zinc-rich zinc oxide. According to example embodiments of inventive concepts, the perpendicular anisotropy enhanced pattern 435 may include a tantalum-rich tantalum oxide.

According to example embodiments of inventive concepts, a nonmagnetic metal compound of the perpendicular anisotropy enhanced pattern 435 may include a non-magnetic metal nitride. For example, the perpendicular anisotropy enhanced pattern 435 may include at least one of a hafnium nitride, a tantalum nitride, a zirconium nitride, a chrome nitride, a vanadium nitride, a molybdenum nitride, a titanium nitride, a tungsten nitride, an yttrium nitride, a magnesium nitride, or a zinc nitride. According to example embodiments of inventive concepts, a content ratio of a nonmagnetic metal in the nonmagnetic metal nitride may be greater than a stoichiometric ratio.

As shown in FIG. 12, a passivation pattern 140a and a second electrode 145a may be sequentially stacked on the perpendicular anisotropy enhanced pattern 435, and a second interlayer dielectric layer 150 may cover the front surface of a substrate 100. Components with the same reference numerals described with the above-mentioned example embodiments will not be described.

In relation to the magnetic memory device according to the above-mentioned example embodiments, the free pattern 430 may have a magnetization direction perpendicular to the second surface (e.g., the top surface of the free pattern 430) of the free pattern 430 by the perpendicular anisotropy enhanced pattern 435. Accordingly, the free pattern 430 may itself not include a perpendicular magnetic material and/or a perpendicular magnetic structure having a perpendicular magnetization. Therefore, a perpendicular magnetic memory device having a very simple structure may be realized, and also a process margin of a method of manufacturing the perpendicular magnetic memory device may be improved. As a result, a perpendicular magnetic memory device having improved or excellent reliability and improved or optimized for a higher degree of integration may be realized. Moreover, since the free pattern 430 may have the perpendicular magnetization direction by the perpendicular anisotropy enhanced pattern 435, the thickness of the free pattern 430 may be reduced. Accordingly, a critical current amount required for changing a magnetization direction of the free pattern 430 may be reduced. As a result, a perpendicular magnetic memory device improved or optimized for lower power consumption and/or higher degree of integration may be realized by reducing a program current amount.

A method of a program operation in the magnetic memory device of FIG. 12 will be described. When the magnetization direction of the free pattern 430 is anti-parallel to the first fixed magnetization direction of the spin polarization pattern 415, electrons in a program current may flow from the reference pattern 420 to the free pattern 430. Major electrons parallel to the first fixed magnetization direction of the spin polarization pattern 415 may be accumulated in the free pattern 430. The magnetization direction of the free pattern 430 may be changed to be parallel to the reference pattern 420 by spin torques of the major electrons accumulated in the free pattern 430.

In contrast, when the magnetization directions of the free pattern 430 and the spin polarization pattern 415 are parallel to each other, electrons in a program current may flow from the free pattern 430 to the reference pattern 420. Minor electrons anti-parallel to the magnetization direction of the spin polarization pattern 415 are reflected by the spin polarization pattern 415 and then are accumulated in the free pattern 430. The free pattern 430 may be reversed to be anti-parallel to the spin polarization pattern 415 by the minor electrons accumulated in the free pattern 430.

Next, modifications of the magnetic memory device according to example embodiments will be described with reference to the drawings. In the following modifications, like reference numerals refer to like elements.

Figure 13A:
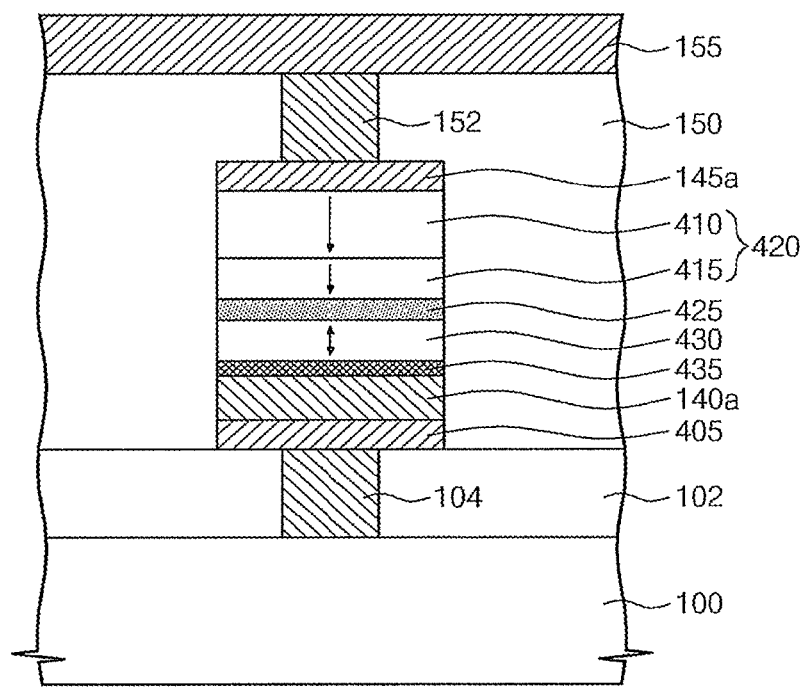
FIG. 13A is a sectional view illustrating a modification of a magnetic memory device according to example embodiments of inventive concepts.

FIG. 13A is a sectional view illustrating a modification of a magnetic memory device according to example embodiments of inventive concepts.

Referring to FIG. 13A, according to this modification, a passivation pattern 140a, a perpendicular anisotropy enhanced pattern 435, a free pattern 430, a tunnel barrier pattern 425, a reference pattern 420, and a second electrode 145a may be sequentially stacked on the first electrode 405. That is, according to this modification, the free pattern 430 may be disposed below the tunnel barrier pattern 425, and the reference pattern 420 may be disposed on the tunnel barrier pattern 425. In example embodiments, the first surface of the free pattern 430, adjacent to the tunnel barrier pattern 425, and the second surface of the free pattern 430, contacting the perpendicular anisotropy enhanced pattern 435, may correspond to a top surface and a bottom surface of the free pattern 430, respectively.

The reference perpendicular magnetic pattern 410 of the reference pattern 420 may be disposed on the tunnel barrier pattern 425, and the spin polarization pattern 415 of the reference pattern 420 may be disposed between the top surface of the tunnel barrier pattern 425 and the reference pattern 420. According to example embodiments of inventive concepts, the bottom surface of the tunnel barrier pattern 425 may contact the free pattern 430, and the top surface of the tunnel barrier pattern 425 may contact the spin polarization pattern 415. In this modification, passivation pattern 140a may be omitted. In example embodiments, the perpendicular anisotropy enhanced pattern 435 may be disposed directly on the first electrode 405.

Figure 13B:
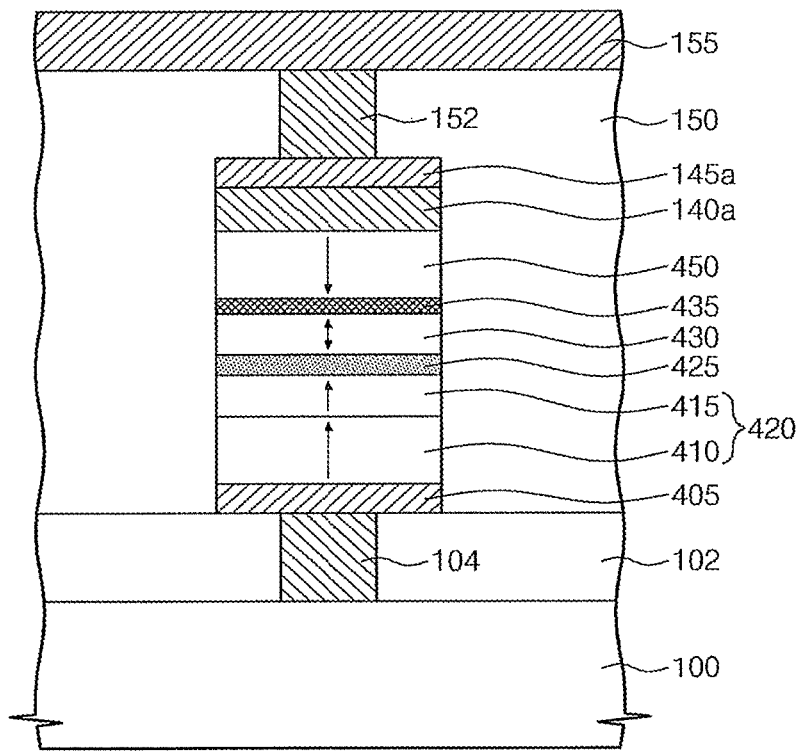
FIG. 13B is a sectional view illustrating another modification of a magnetic memory device according to example embodiments of inventive concepts.

FIG. 13B is a sectional view illustrating another modification of a magnetic memory device according to example embodiments of inventive concepts.

Referring to FIG. 13B, according to this modification, a fixed perpendicular magnetic pattern 450 may be disposed on one surface of the perpendicular anisotropy enhanced pattern 435. The perpendicular anisotropy enhanced pattern 435 may be disposed between the fixed perpendicular magnetic pattern 450 and the free pattern 430. According to this modification, the reference pattern 420, the tunnel barrier pattern 425, the free pattern 430, the perpendicular anisotropy enhanced pattern 435, the fixed perpendicular magnetic pattern 450, the passivation pattern 140a, and/or the second electrode 145a may be sequentially stacked on the first electrode 405.

The fixed perpendicular magnetic pattern 450 may have a fixed magnetization direction being substantially perpendicular to the top surface of the free pattern 430. According to this modification, the reference pattern 420 may correspond to a first reference pattern, and the fixed perpendicular magnetic pattern 450 may correspond to a second reference pattern. According to example embodiments of inventive concepts, the fixed perpendicular magnetic pattern 450 may be anti-parallel to the fixed magnetization direction (especially, the fixed magnetization direction of the spin polarization pattern 415 adjacent to the tunnel barrier pattern 425) of the reference pattern 420.

The fixed perpendicular magnetic pattern 450 by itself may have a perpendicular magnetization direction. For example, the fixed perpendicular magnetic pattern 450 includes at least one of a perpendicular magnetic material (e.g., CoFeTb, CoFeGd, or CoFeDy and so on), a perpendicular magnetic material of an L10 structure, CoPt of a hexagonal close packed lattice structure, or an alloy thereof. The perpendicular magnetic material of an L10 structure may include at least one of FePt of an $L1_0$ structure, FePd of an $L1_0$ structure, CoPd of an $L1_0$ structure, or CoPt of an $L1_0$ structure. When the fixed perpendicular magnetic pattern 450 includes CoFeTb, a Tb content ratio in CoFeTb may be equal to or more than about 10%. Similarly, when the fixed perpendicular magnetic pattern 450 includes CoFeGd, a Gd content ratio in CoFeGb may be equal to or more than about 10%. According to example embodiments of inventive concepts, the fixed perpendicular magnetic pattern 450 may include a perpendicular magnetic structure having magnetic layers and non-magnetic layers, which are alternately and repeatedly stacked. For example, the perpendicular magnetic structure may include at least one of (Co/Pt)n, (CoFe/Pt)n, (CoFe/Pd)n, (CoP)n, (Co/Ni)n, (CoNi/Pt)n, (CoCr/Pt)n, or (CoCr/Pd)n (n is the number of stacked layers).

When the magnetization direction of the free pattern 430 is anti-parallel to that of the spin polarization pattern 415, electrons in a program current may flow from the reference pattern 420 to the free pattern 430. First electrons penetrating the spin polarization pattern 415 and having spins parallel to the magnetization direction of the spin polarization pattern 415 may be accumulated in the free pattern 430. In addition, second electrons reflected by the magnetization direction of the fixed perpendicular magnetic pattern 450 and having spins anti-parallel to the magnetization direction of the fixed perpendicular magnetic pattern 450 may be accumulated in the free pattern 430. The spin directions of the second electrons are parallel to those of the first electrons. By spin torques of the first and second electrons accumulated in the free pattern 430, the magnetization direction of the free pattern 430 is reversed, such that it may be parallel to the magnetization direction of the spin polarization pattern 415. The first and second electrons are accumulated in the free pattern 430 such that a critical current density for reversing the free pattern 430 may be reduced.

When the magnetization direction of the free pattern 430 is parallel to that of the spin polarization pattern 415, electrons in a program current may flow from the fixed perpendicular magnetic pattern 450 to the reference pattern 420. Electrons penetrating the fixed perpendicular magnetic pattern 450 and having spins parallel to the magnetization direction of the fixed perpendicular magnetic pattern 450 may be accumulated in the free pattern 430. In addition, electrons reflected by the magnetization direction of the spin polarization pattern 415 and anti-parallel to the magnetization direction of the spin polarization pattern 415 may be accumulated in the free pattern 430. Due to this, the magnetization direction of the free pattern 430 is reversed to be anti-parallel to the magnetization direction of the spin polarization pattern 415.

According to example embodiments, similar to the magnetic memory device of FIG. 13A, the free pattern 430 and the fixed perpendicular magnetic pattern 450 of FIG. 13B may be disposed below the tunnel barrier pattern 425, and the reference pattern 420 may be disposed on the tunnel barrier pattern 425. In example embodiments, the passivation pattern 140a, the fixed perpendicular magnetic pattern 450, the perpendicular anisotropy enhanced pattern 435, the free pattern 430, the tunnel barrier pattern 425, the spin polarization pattern 415, the reference perpendicular magnetic pattern 410, and/or the second electrode 145a may be sequentially stacked on the first electrode 405. In example embodiments, the passivation pattern 140a may be omitted.

Figure 13C:
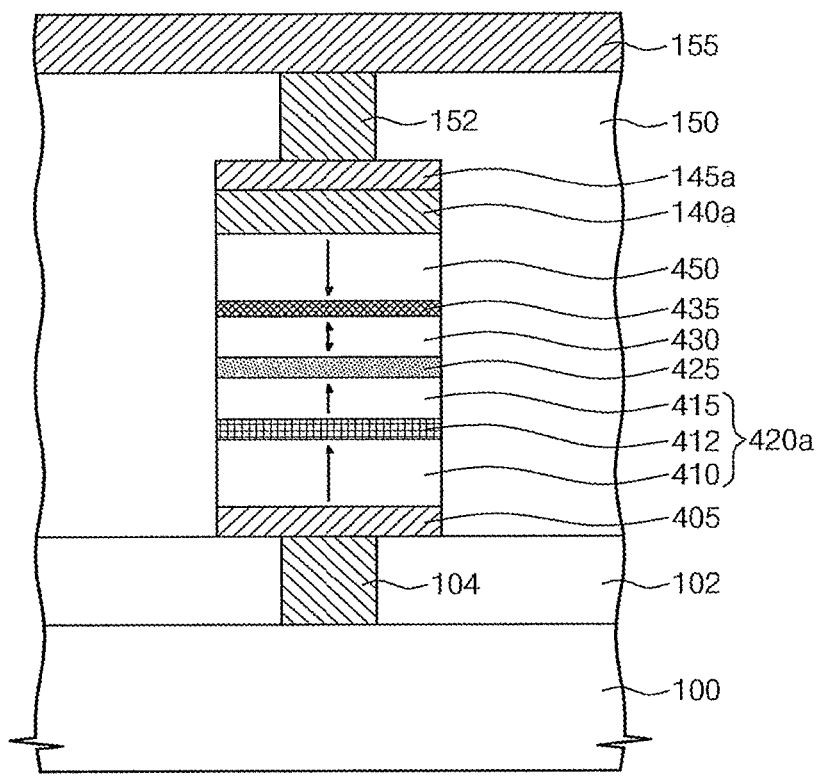
FIG. 13C is a sectional view illustrating another modification of a magnetic memory device according to example embodiments of inventive concepts.

FIG. 13C is a sectional view illustrating another modification of a magnetic memory device according to example embodiments of inventive concepts.

Referring to FIG. 13C, according to this modification, a reference pattern 420a may include the reference perpendicular magnetic pattern 410, the spin polarization pattern 415, and an exchange coupling pattern 412 disposed therebetween. According to this modification, the exchange coupling pattern 412 may combine the magnetization direction of the reference perpendicular magnetic pattern 410 and the magnetization direction of the spin polarization pattern 415 to be parallel to each other. By the exchange coupling pattern 412, a parallel combination between the magnetization directions of the reference perpendicular magnetic pattern 410 and the spin polarization pattern 415 may be enhanced. According to this modification, the exchange coupling pattern 412 may include at least one of nonmagnetic metals such as titanium, tantalum, or magnesium, an oxide thereof, or a nitride thereof.

According to example embodiments of inventive concepts, the fixed perpendicular magnetic pattern 450 may be omitted from the magnetic memory device of FIG. 13C.

According to example embodiments of inventive concepts, the perpendicular anisotropy enhanced pattern 435 and the free pattern 430 may be disposed below the tunnel barrier pattern 425 in the magnetic memory device of FIG. 13C. In example embodiments, the passivation pattern 140a, the fixed perpendicular magnetic pattern 450, the perpendicular anisotropy enhanced pattern 435, the free pattern 430, the tunnel barrier pattern 425, the spin polarization pattern 415, the exchange coupling pattern 412, the reference perpendicular magnetic pattern 410, and/or the second electrode 145a may be sequentially stacked on the first electrode 405. In example embodiments, the passivation pattern 140a and/or the fixed perpendicular magnetic pattern 450 may be omitted.

Figure 13D:
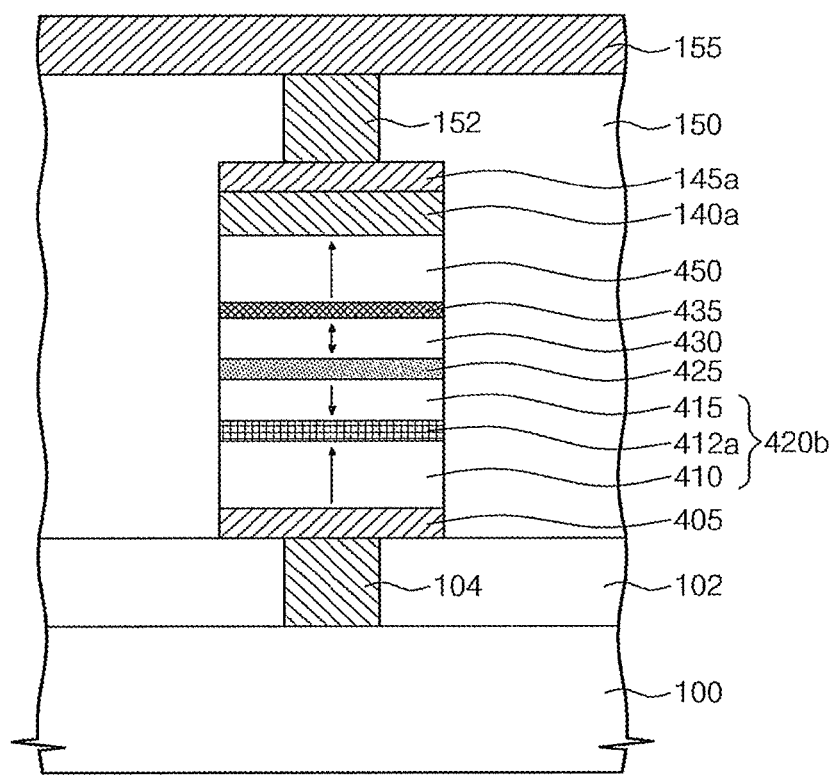
FIG. 13D is a sectional view illustrating another modification of a magnetic memory device according to example embodiments of inventive concepts.

FIG. 13D is a sectional view illustrating another modification of a magnetic memory device according to example embodiments of inventive concepts.

Referring to FIG. 13D, according to this modification, an exchange coupling pattern 412a included in a reference pattern 420b may combine the magnetization directions of the spin polarization pattern 415 and the reference perpendicular magnetic pattern 410 to be anti-parallel to each other. Accordingly, a magnetic stray field by the reference pattern 420b may be reduced or minimized such that reliability of the magnetic memory device may be improved. For example, the exchange coupling pattern 412a may include at least one rare metal such as Ru, Ir, or Rh. In the modification, the magnetization direction of the fixed perpendicular magnetic pattern 450 may be anti-parallel to that of the spin polarization pattern 415.

According to example embodiments of inventive concepts, the fixed perpendicular magnetic pattern 450 may be omitted from the magnetic memory device of FIG. 13D.

According to example embodiments of inventive concepts, the perpendicular anisotropy enhanced pattern 435 and the free pattern 430 may be disposed below the tunnel barrier pattern 425 in the magnetic memory device of FIG. 13D. In example embodiments, the passivation pattern 140a, the fixed perpendicular magnetic pattern 450, the perpendicular anisotropy enhanced pattern 435, the free pattern 430, the tunnel barrier pattern 425, the spin polarization pattern 415, the exchange coupling pattern 412a, the reference perpendicular magnetic pattern 410, and/or the second electrode 145a may be sequentially stacked on the first electrode 405. In example embodiments, the passivation pattern 140a and/or the fixed perpendicular magnetic pattern 450 may be omitted.

Figure 13E:
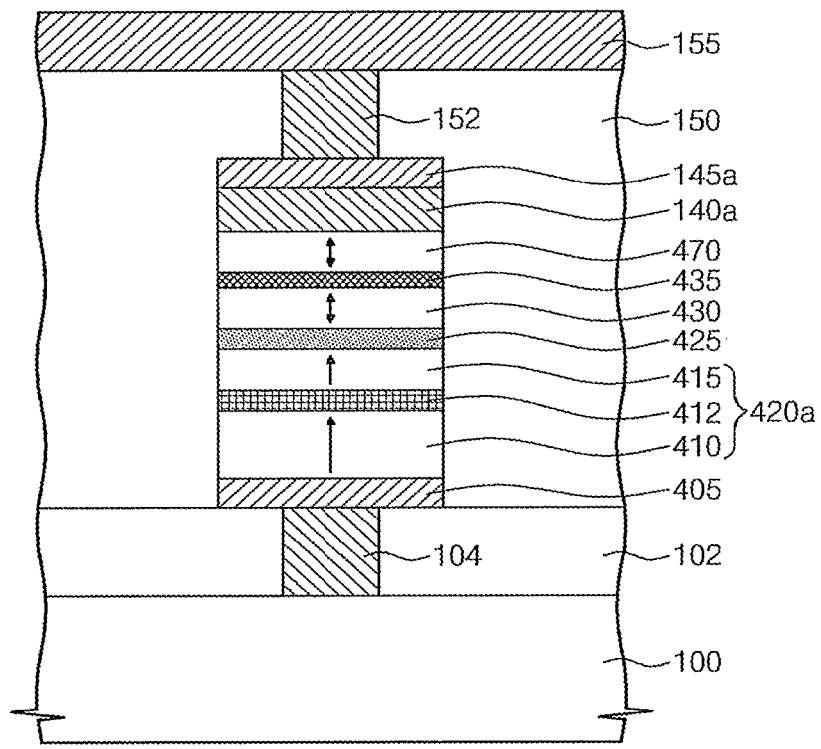
FIG. 13E is a sectional view illustrating another modification of a magnetic memory device according to example embodiments of inventive concepts.

FIG. 13E is a sectional view illustrating another modification of a magnetic memory device according to example embodiments of inventive concepts.

Referring to FIG. 13E, a free perpendicular magnetic pattern 470 may be disposed on one surface of the perpendicular anisotropy enhanced pattern 435. The perpendicular anisotropy enhanced pattern 435 may be disposed between the free pattern 430 and the free perpendicular magnetic pattern 470. For example, the reference pattern 420a, the tunnel barrier pattern 425, the free pattern 430, the perpendicular anisotropy enhanced pattern 435, the free perpendicular magnetic pattern 470, the passivation pattern 140a, and/or the second electrode 145a may be sequentially stacked on the first electrode 405. The free perpendicular magnetic pattern 470 may have a magnetization direction that is substantially perpendicular to the top and bottom surfaces of the free pattern 430. The magnetization direction of the free perpendicular magnetic pattern 470 may be changeable to be parallel or antiparallel the fixed magnetization direction (for example, the magnetization direction of the spin polarization pattern 415) of the reference pattern 420a. The magnetization direction of the free perpendicular magnetic pattern 470 may be parallel to that of the free pattern 430. The magnetization direction of the free perpendicular magnetic pattern 470 and the magnetization direction of the free pattern 430 may be all changeable. The free perpendicular magnetic pattern 470 and the free pattern 430 may be included in a data storage element. Due to the free perpendicular magnetic pattern 470, data retention of a unit cell of the magnetic memory device may be improved.

The free perpendicular magnetic pattern 470 by itself may have a perpendicular magnetization direction. For example, free perpendicular magnetic pattern 470 may include at least one of a perpendicular magnetic material (e.g., CoFeTb, CoFeGd, or CoFeDy and so on), a perpendicular magnetic material of an L10 structure, CoPt of a hexagonal close packed lattice structure, or an alloy thereof. The perpendicular magnetic material of an L10 structure may include at least one of FePt of an $L1_0$ structure, FePd of an $L1_0$ structure, CoPd of an $L1_0$ structure, or CoPt of an $L1_0$ structure. When the free perpendicular magnetic pattern 470 includes CoFeTb, a Tb content ratio in CoFeTb may be equal to or more than about 10%. Similarly, when the free perpendicular magnetic pattern 470 includes CoFeGd, a Gd content ratio in CoFeGb may be equal to or more than about 10%. According to example embodiments of inventive concepts, the free perpendicular magnetic pattern 470 may include a perpendicular magnetic structure having magnetic layers and nonmagnetic layers, which are alternately and repeatedly stacked. For example, the perpendicular magnetic structure may include at least one of (Co/Pt)n, (CoFe/Pt)n, (CoFe/Pd)n, (CoP)n, (Co/Ni)n, (CoNi/Pt)n, (CoCr/Pt)n, or (CoCr/Pd)n (n is the number of stacked layers).

The free perpendicular magnetic pattern 470 may have a first critical current amount, and the reference perpendicular magnetic pattern 410 may have a second critical current amount. The first critical current amount may mean a current amount required to change the magnetization direction of the free perpendicular magnetic pattern 470, and the second critical current amount may mean a current amount required to change the magnetization direction of the reference perpendicular magnetic pattern 410. In example embodiments where the first critical current amount may be less than the second critical current amount, a program current amount may be greater than the first critical current amount and less than the second critical current amount. Accordingly, the magnetization direction of the free perpendicular magnetic pattern 470 may be changeable but the magnetization direction of the reference perpendicular magnetic pattern 410 may be fixed. The first and second critical current amounts may be determined by various factors. For example, in order for the first critical current amount to be less than the second critical current amount, the thickness of the free perpendicular magnetic pattern 470 may be thinner than that of the reference perpendicular magnetic pattern 410. Or, coercive force of the free perpendicular magnetic pattern 470 may be less than that of the reference perpendicular magnetic pattern 410.

According to example embodiments of inventive concepts, the reference pattern 420a may be replaced with the reference pattern 420b of FIG. 13D in the magnetic memory device of FIG. 13E.

According to example embodiments of inventive concepts, the passivation pattern 140a, the free perpendicular magnetic pattern 470, the perpendicular anisotropy enhanced pattern 435, the free pattern 430, the tunnel barrier pattern 425, the reference pattern 420a, and/or the second electrode 145a may be sequentially stacked on the first electrode 405. In example embodiments, the spin polarization pattern 415 of the reference pattern 420a may be disposed right on the tunnel barrier pattern 425. In example embodiments, the reference pattern 420a may be replaced with the reference pattern 420b of FIG. 13D. The passivation pattern 140a may be omitted.

The magnetic memory devices according to the above-mentioned example embodiments may be realized through semiconductor packages of various forms. For example, the magnetic memory devices according to embodiments of inventive concepts may be packaged through various package methods such as Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP). Packages having a magnetic memory device according to example embodiments of inventive concepts may further include controller for controlling the magnetic memory device and/or logic devices.

Figure 14:
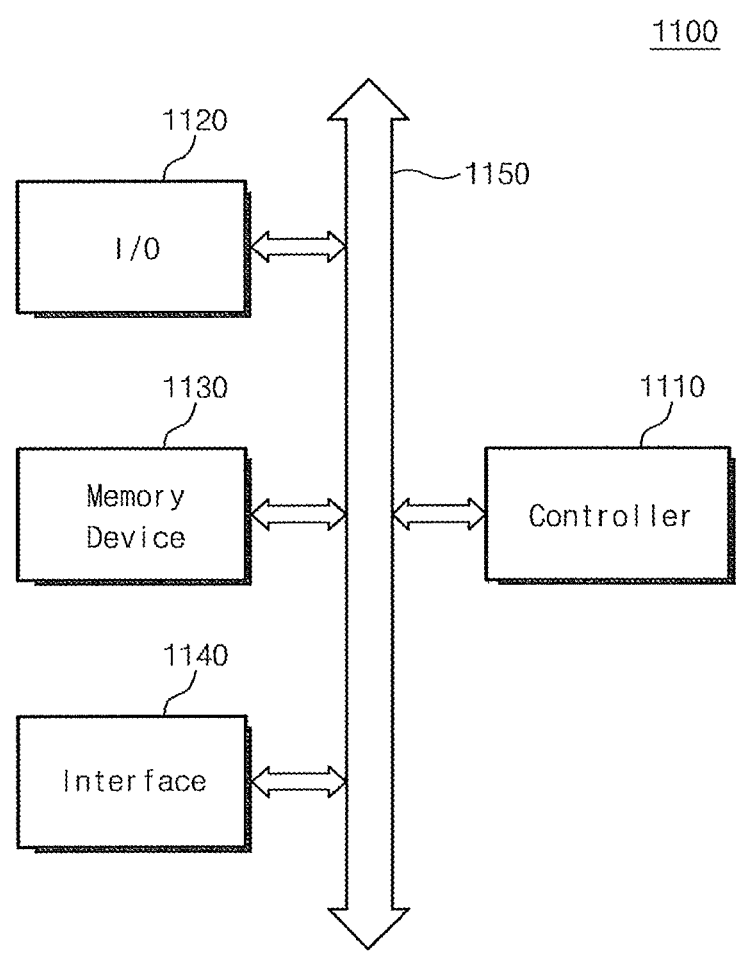
FIG. 14 is a block diagram illustrating an electronic system including a magnetic memory device according to example embodiments of inventive concepts.

FIG. 14 is a block diagram illustrating an electronic system including a magnetic memory device according to example embodiments of inventive concepts.

Referring to FIG. 14, the electronic system 1100 may include a controller 1110, an input/output device (or I/O) 1120, a memory device 1130, an interface 1140, and a bus 1150. The controller 1110, the input/output device 1120, the memory device 1130 and/or the interface 1140 may be connected through the bus 1150. The bus 1150 corresponds to a path through which data may be transferred.

The controller 1110 may include at least one of microprocessors, digital signal processors, microcontrollers, and logic devices for performing similar functions thereof. The input/output device 1120 may include a keypad, a keyboard, and a display device. The memory device 1130 may store data and/or commands. The memory device 1130 may include at least one of the magnetic memory devices described in the above-mentioned embodiments. Moreover, the memory device 1130 may further include semiconductor memory devices of different forms (e.g., flash memory devices, phase change memory devices, DRAM devices and/or SRAM devices). The interface 1140 transmits data to a communication network or receives data from the communication network. The interface 1140 may be in a wired or wireless form. For example, the interface 1140 may include an antenna or a wired/wireless transceiver. Although not illustrated in the drawings, the electronic system 1100 may be an operating memory device for improving an operation of the controller 1110 and may further include a high-speed DRAM device and/or SRAM device.

The electronic system 1100 may be applied to a personal digital assistant (PDA), a portable computer, a web tablet, a wireless phone, a mobile phone, a digital music player, a memory card, and any electronic products for transmitting and receiving information in a wireless environment.

Figure 15:
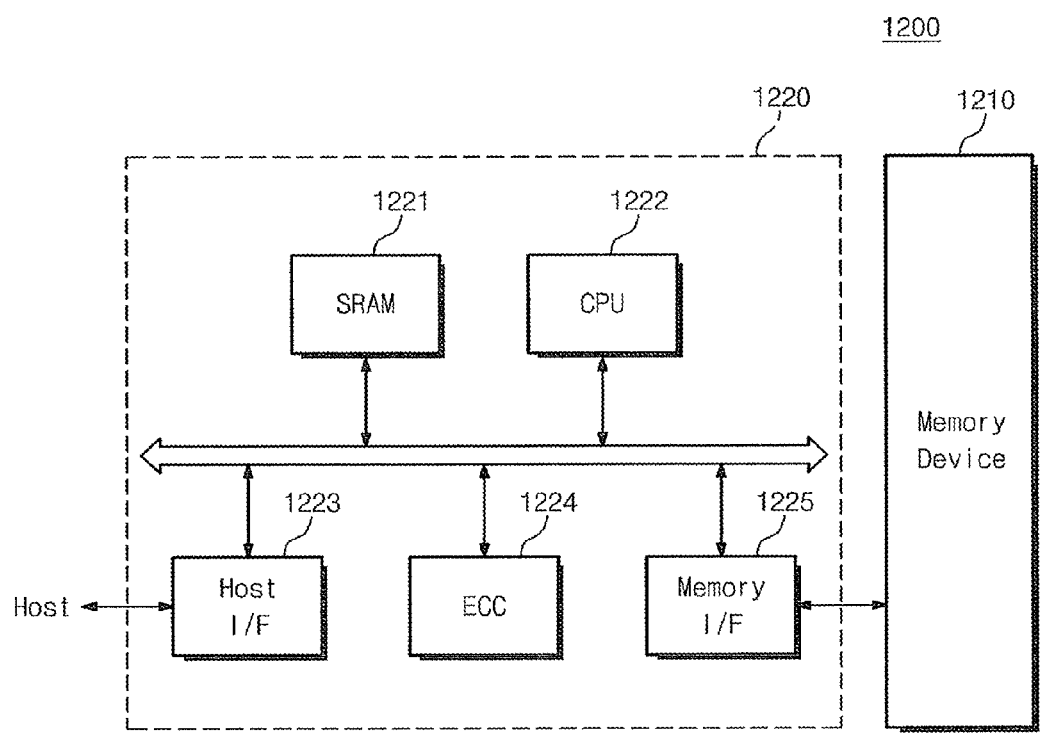
FIG. 15 is a block diagram illustrating a memory card including a magnetic memory device according to example embodiments of inventive concepts.

FIG. 15 is a block diagram illustrating a memory card including a magnetic memory device based on example embodiments of inventive concepts.

Referring to FIG. 15, the memory card 1200 according to example embodiments of inventive concepts includes a memory device 1210. The memory device 1210 may include at least one of magnetic memory devices described in the above-mentioned example embodiments. Additionally, the memory device 1210 may further include semiconductor memory devices of different forms (e.g., flash memory devices, phase change memory devices, DRAM devices and/or SRAM devices). The memory card 1200 may include a memory controller 1220 for controlling data exchange between a host and the memory device 1210.

The memory controller 1220 may include a processing unit 1222 for controlling general operations of a memory card. Moreover, the memory controller 1220 may include a SRAM 1221 used as an operating memory of the processing unit 1222. Furthermore, the memory controller 1220 may further include a host interface 1223 and a memory interface 1225. The host interface 1223 may include a data exchange protocol between the memory card 1200 and a host. The memory interface 1225 may connect the memory controller 1220 with the memory device 1210. Furthermore, the memory controller 1220 may further include an error correction code (ECC) block 1224. The ECC block 1224 may detect and correct errors of data read from the memory device 1210. Although not illustrated in the drawings, the memory card 1200 may further include a ROM device for storing code data to interface with a host. The memory card 1200 may be used as portable data storage card. Alternatively, the memory card 1200 may be realized with a solid state disk (SSD) that may replace a hard disk of a computer system.

As discussed above, example embodiments of inventive concepts disclose the use of a non-magnetic non-parallel magnetism generator to increase the magnetization of a free pattern, for example of an MTJ, in a direction non-parallel to a major (for example, first or second) surface of the free pattern. In example embodiments of inventive concepts, the non-magnetic non-parallel magnetism generator may include the nonmagnetic metal-oxide patterns 135a, 135a', the surface local regions 160, 170, the particles 180, 280, the thin patterns 235a, 235a', the perpendicular anisotropy enhanced pattern 435, or any combination thereof. In example embodiments of inventive concepts, the non-magnetic non-parallel magnetism generator may increase the magnetization of a free pattern, for example of an MTJ, in a direction perpendicular to the major surface of the free pattern. In example embodiments of inventive concepts, the free pattern may be an inplane free layer or a perpendicular free pattern.

Figure 16:
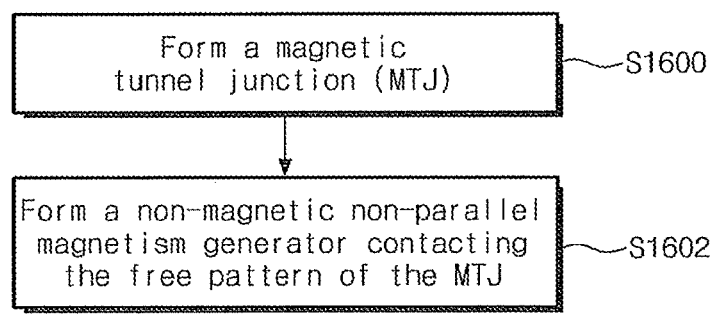
FIG. 16 is a flowchart illustrating methods of increasing the perpendicularity of a perpendicular free pattern according to example embodiments of inventive concepts.

In a broader sense, example embodiments of inventive concepts are directed to methods of increasing the perpendicularity of a perpendicular free pattern. For example as shown in FIG. 16, example embodiments of inventive concepts are directed to a method of forming a magnetic tunneling junction S1600, which may further include forming a free pattern, forming a reference pattern, and forming a tunnel barrier pattern as discussed above (as well as forming any number of other patterns) and forming a non-magnetic non-parallel magnetism generator contacting the free pattern 1602.

Figure 17:
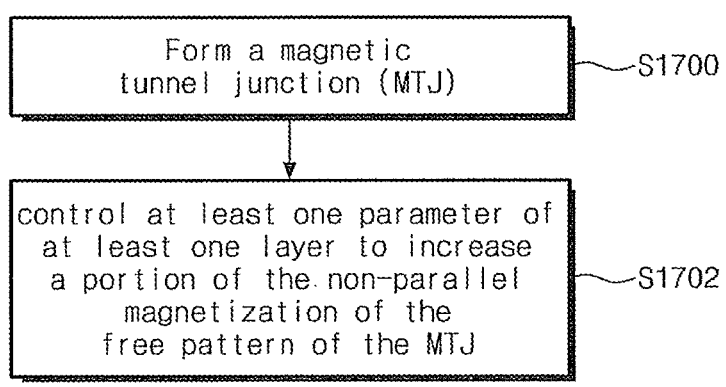
FIG. 17 is a flowchart illustrating methods of controlling the parameters of a method of manufacturing a magnetic memory device according to example embodiments of inventive concepts.

In an even broader sense, example embodiments of inventive concepts are directed to methods of controlling the parameters of a method of manufacturing a magnetic memory device to produce an inplane free pattern or a perpendicular free pattern, depending on which is desired. For example as shown in FIG. 17, example embodiments of inventive concepts are directed to a method of forming a magnetic tunneling junction S1700, which may further include forming a free pattern, forming a reference pattern, and forming a tunnel barrier pattern as discussed above (as well as forming any number of other patterns) and controlling at least one parameter of at least one layer to increase a portion of the non-parallel magnetization of the free pattern of the MTJ.

In example embodiments of inventive concepts, for example, at least one of the thickness and the material of at least one of the free pattern 130a, the non-magnetic non-parallel magnetism generator 135a, and the passivation pattern 140a of FIG. 1A, may be controlled to convert a portion of the magnetization of the free pattern from a direction parallel to a major surface of the free pattern, to the direction non-parallel to the major surface of the free pattern.

In example embodiments of inventive concepts, such a method may also include converting an inplane free pattern to a perpendicular free pattern, which allows for the simpler process of forming an inplane free pattern to be implemented, while still achieving the benefits of a perpendicular free pattern.

According to example embodiments of inventive concepts, by reducing or minimizing a critical switching current density, a magnetic memory device of lower power consumption may be realized. Additionally, a magnetic memory device improved or optimized for higher degree of integration and reducing or minimizing sizes of switching devices that control a critical switching current may be realized.

The above-disclosed subject matter is to be considered illustrative and not restrictive, and the appended claims are intended to cover all such modifications, enhancements, and other example embodiments, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description.

What is claimed is:

1. A magnetic memory device comprising:
   a reference pattern on a substrate;
   a free pattern on the substrate;
   a tunnel barrier pattern between the free pattern and the reference pattern; and
   particles within the free pattern and comprising a nonmagnetic conductive material.

2. The magnetic memory device of claim 1, wherein the free pattern comprises a first surface and a second surface opposite to each other;
   the first surface of the free pattern is adjacent to the tunnel barrier pattern; and
   the particles are spaced from the first and second surfaces.

3. The magnetic memory device of claim 1, wherein the free pattern comprises a first surface adjacent to the tunnel barrier pattern and a second surface opposite to the first surface; and
   the reference pattern and the tunnel barrier pattern correspond to a first reference pattern and a first tunnel barrier pattern, respectively, and
   further comprising:
   a second reference pattern on the second surface of the free pattern; and
   a second tunnel barrier pattern between the second surface of the free pattern and the second reference pattern.

4. The magnetic memory device of claim 1, wherein the reference pattern comprises a first magnetic material;
the free pattern comprises a second magnetic material;
each of the first and second magnetic materials comprises iron (Fe); and
a content ratio of iron (Fe) in the second magnetic material is equal to or greater than a content ratio of iron (Fe) in the first magnetic material.

* * * * *